(12) United States Patent
Peng et al.

(10) Patent No.: US 11,233,149 B2
(45) Date of Patent: Jan. 25, 2022

(54) SPACER STRUCTURES FOR SEMICONDUCTOR DEVICES

(71) Applicant: Taiwan Semiconductor Manufacturing Co., Ltd., Hsinchu (TW)

(72) Inventors: Cheng-Yi Peng, Taipei (TW); Song-Bor Lee, Zhubei (TW)

(73) Assignee: Taiwan Semiconductor Manufacturing Co., . Ltd.

( * ) Notice: Subject to any disclaimer, the term of this patent is extended or adjusted under 35 U.S.C. 154(b) by 0 days.

(21) Appl. No.: 16/807,303

(22) Filed: Mar. 3, 2020

(65) Prior Publication Data

US 2021/0280716 A1 Sep. 9, 2021

(51) Int. Cl.
*H01L 29/78* (2006.01)
*H01L 29/06* (2006.01)
(Continued)

(52) U.S. Cl.
CPC ...... *H01L 29/7848* (2013.01); *H01L 29/0665* (2013.01); *H01L 29/165* (2013.01);
(Continued)

(58) Field of Classification Search
CPC ....... H01L 21/02603; H01L 21/823878; H01L 29/0649; H01L 29/0665; H01L 29/0673; H01L 29/0669; H01L 29/165; H01L 29/42392; H01L 29/66439; H01L 29/66553; H01L 29/6656; H01L 29/66636;
(Continued)

(56) References Cited

U.S. PATENT DOCUMENTS 9,093,530 B2 7/2015 Huang et al.
9,171,929 B2 10/2015 Lee et al.
(Continued)

FOREIGN PATENT DOCUMENTS

KR 20180113118 A 10/2018
KR 20190078818 A 7/2019

*Primary Examiner* — David C Spalla
(74) *Attorney, Agent, or Firm* — Sterne, Kessler, Goldstein & Fox P.L.L.C.

(57) ABSTRACT

The structure of a semiconductor device with inner spacer structures between source/drain (S/D) regions and gate-all-around structures and a method of fabricating the semiconductor device are disclosed. The semiconductor device includes a substrate, a stack of nanostructured layers with first and second nanostructured regions disposed on the substrate and first and second source/drain (S/D) regions disposed on the substrate. Each of the first and second S/D regions includes an epitaxial region wrapped around each of the first nanostructured regions. The semiconductor device further includes a gate-all-around (GAA) structure disposed between the first and second S/D regions and wrapped around each of the second nanostructured regions, a first inner spacer disposed between an epitaxial sub-region of the first S/D region and a gate sub-region of the GAA structure, a second inner spacer disposed between an epitaxial sub-region of the second S/D region and the gate sub-region of the GAA structure, and a passivation layer disposed on sidewalls of the first and second nanostructured regions.

19 Claims, 33 Drawing Sheets

(51) Int. Cl.
*H01L 29/165* (2006.01)
*H01L 29/423* (2006.01)
*H01L 29/66* (2006.01)

(52) U.S. Cl.
CPC .... *H01L 29/42392* (2013.01); *H01L 29/6656* (2013.01); *H01L 29/66636* (2013.01); *H01L 29/66795* (2013.01); *H01L 29/0673* (2013.01)

(58) Field of Classification Search
CPC ............. H01L 29/66795; H01L 29/775; H01L 29/7848; H01L 29/785
See application file for complete search history.

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 10,134,640 B1 * | 11/2018 | Chiang ........... H01L 21/823878 |
| 2014/0091279 A1 | 4/2014 | Kachian et al. |
| 2018/0294331 A1 | 10/2018 | Cho et al. |
| 2019/0067121 A1 | 2/2019 | Chiang et al. |
| 2019/0067452 A1 * | 2/2019 | Cheng ................. H01L 21/8221 |
| 2019/0131431 A1 | 5/2019 | Cheng et al. |
| 2019/0198639 A1 * | 6/2019 | Kim ................... H01L 29/6656 |

\* cited by examiner

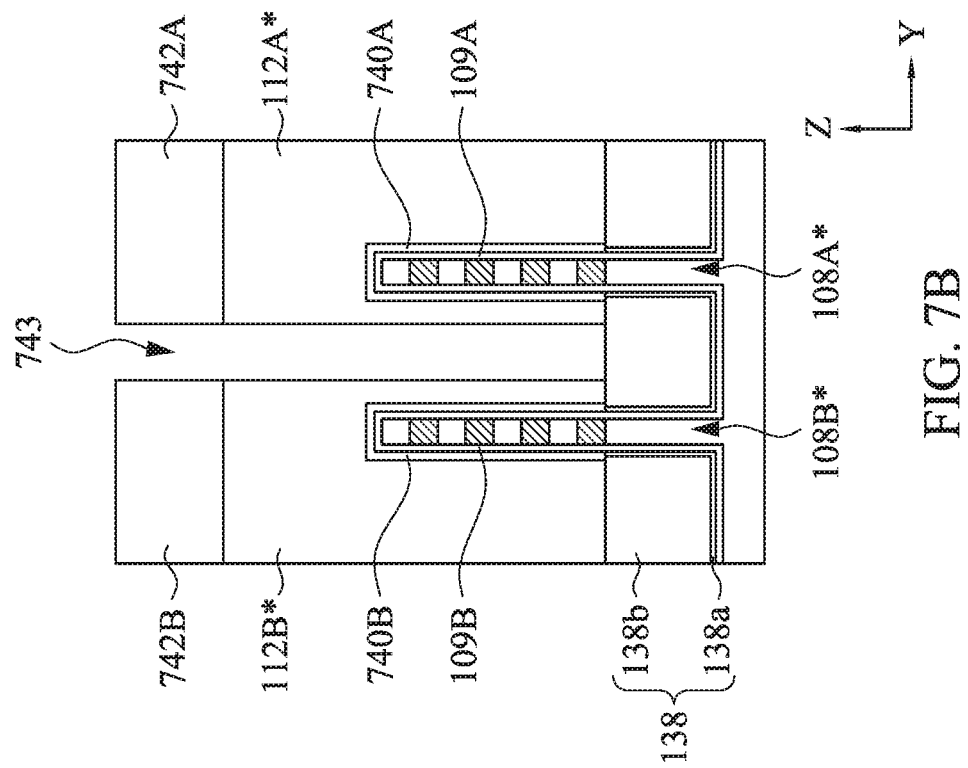
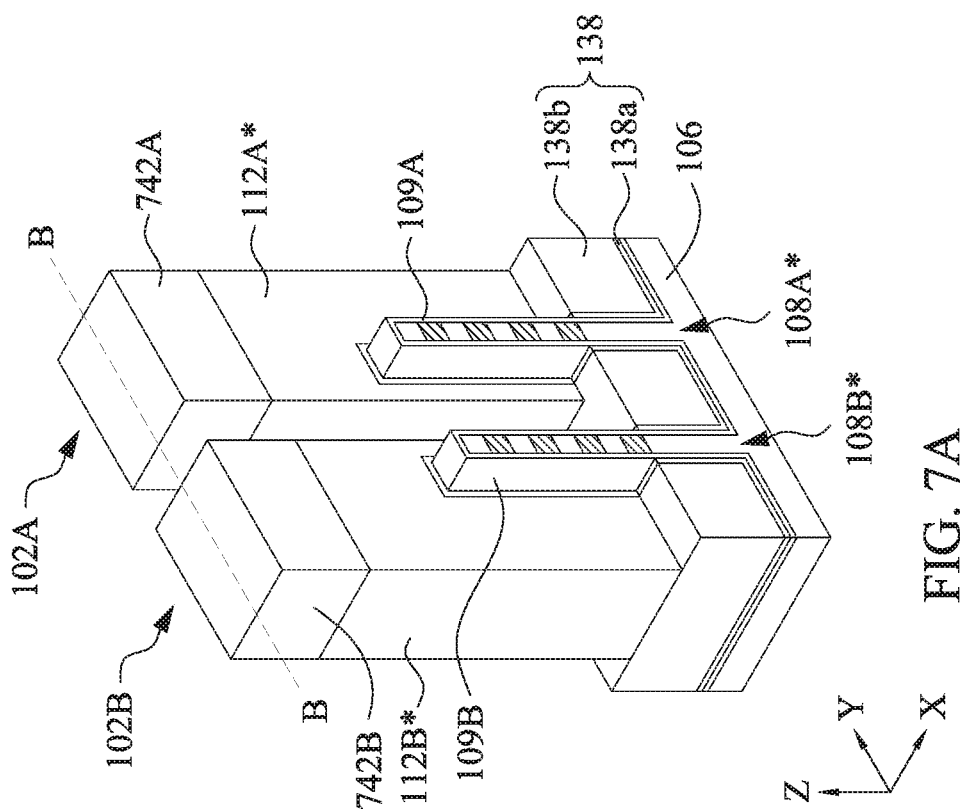
FIG. 7B
FIG. 7A

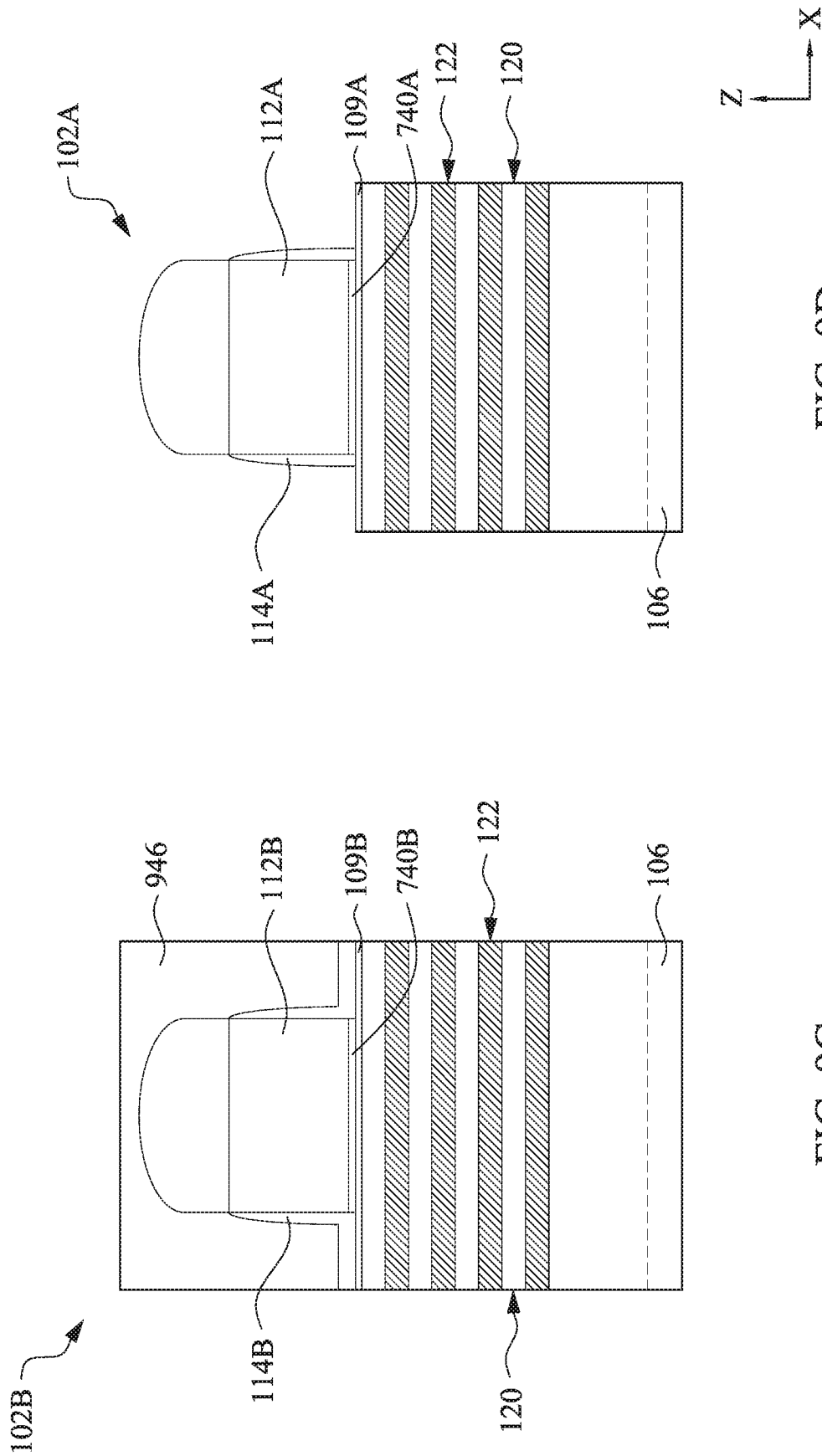

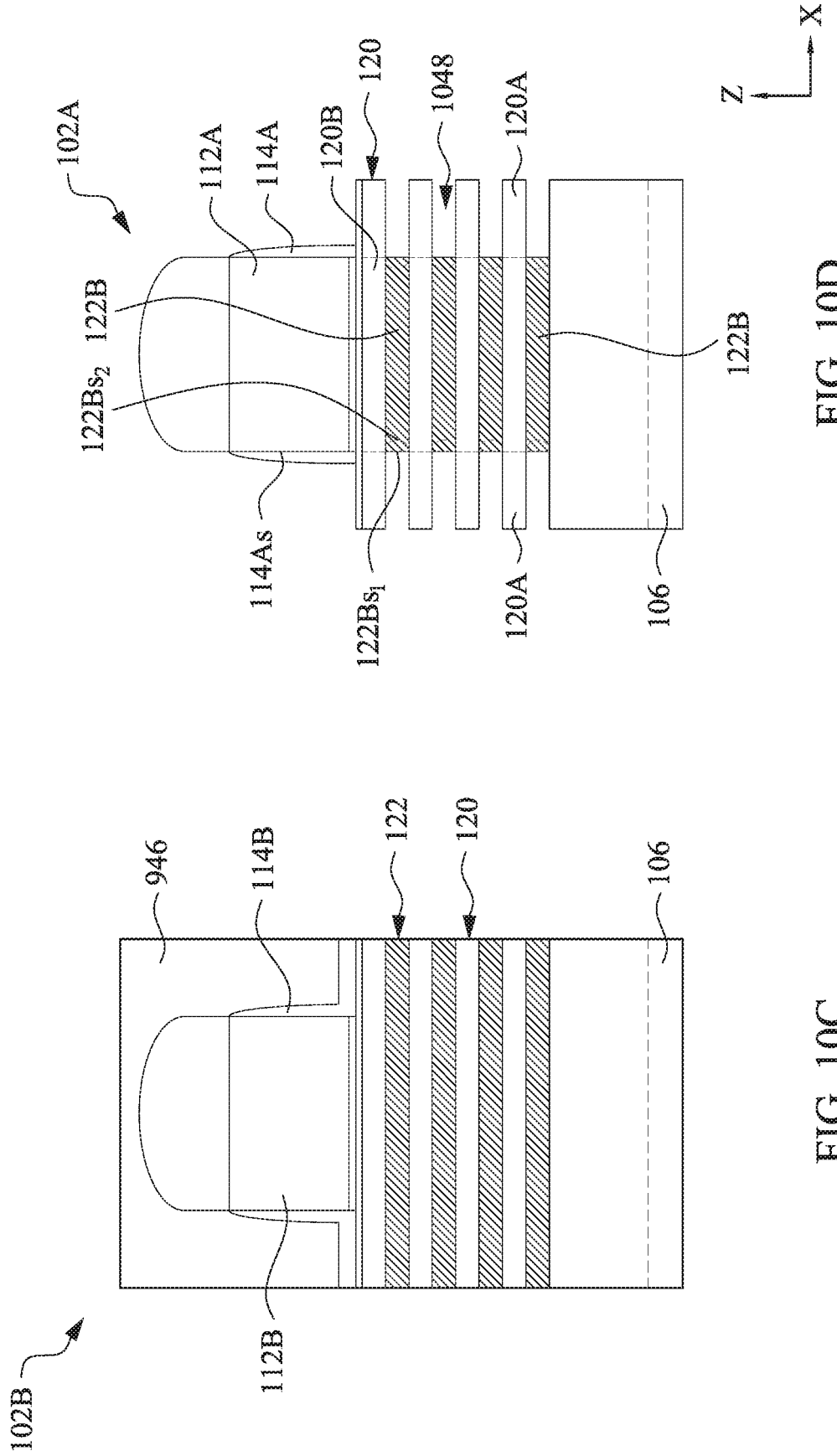

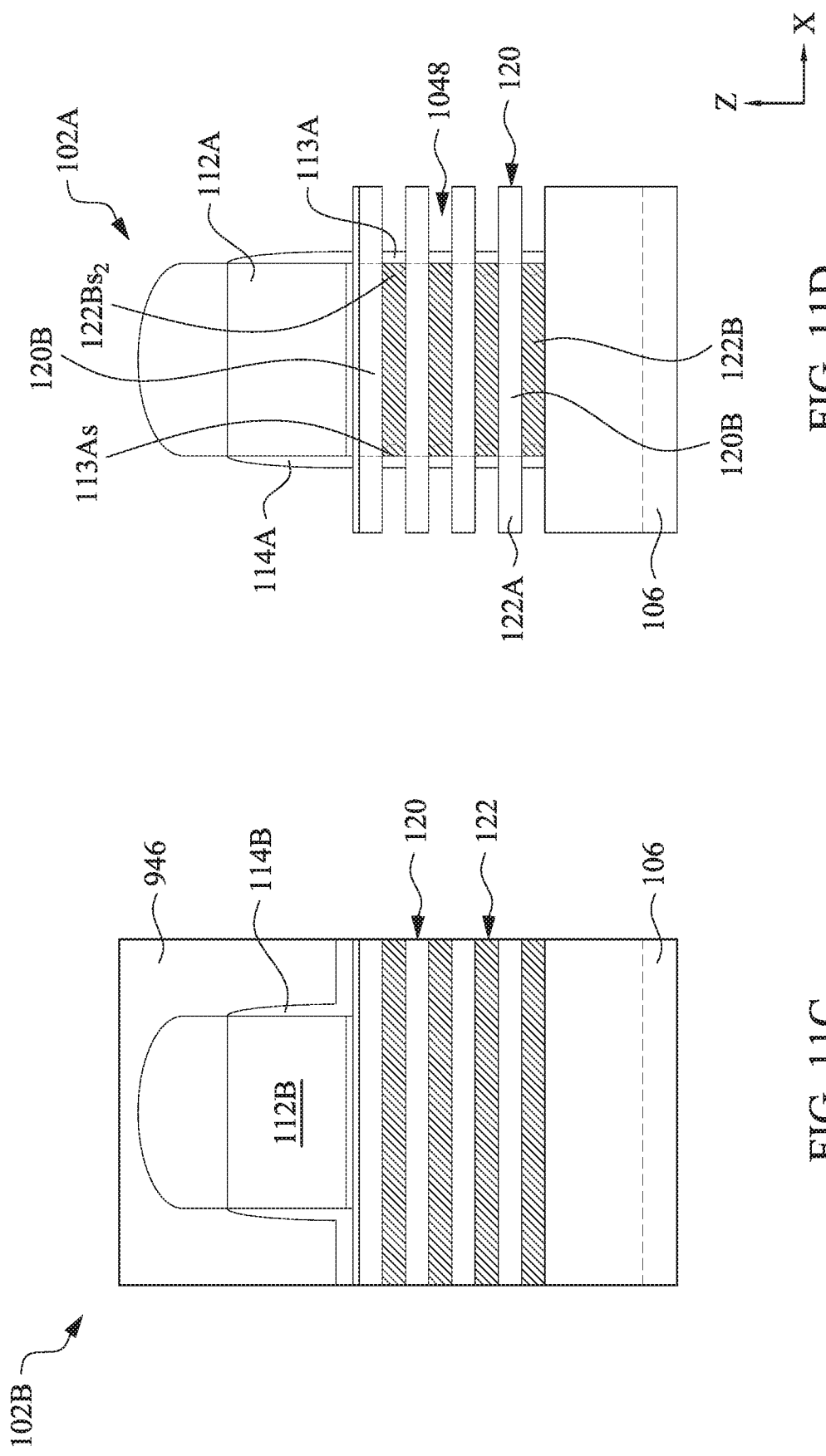

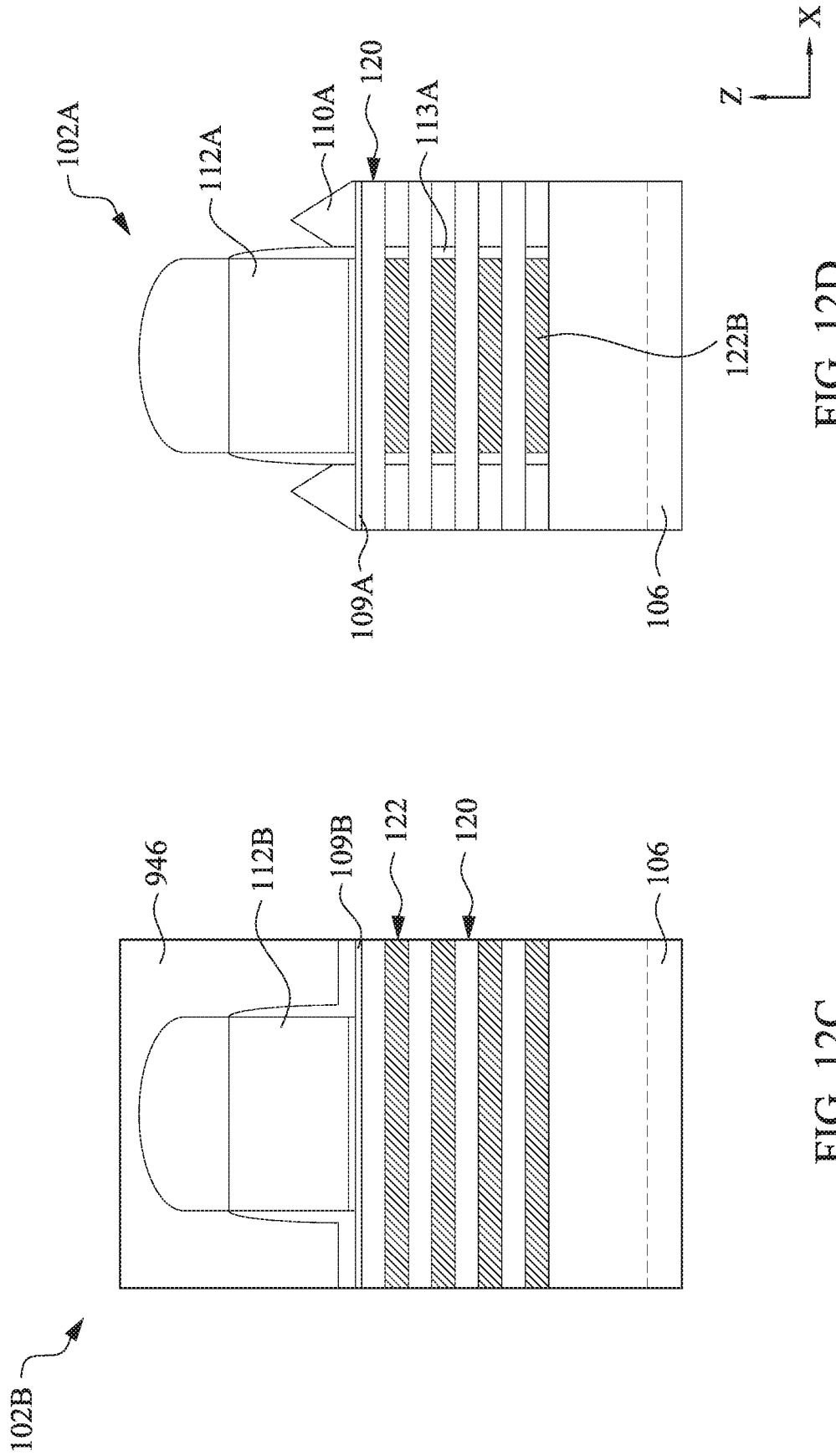

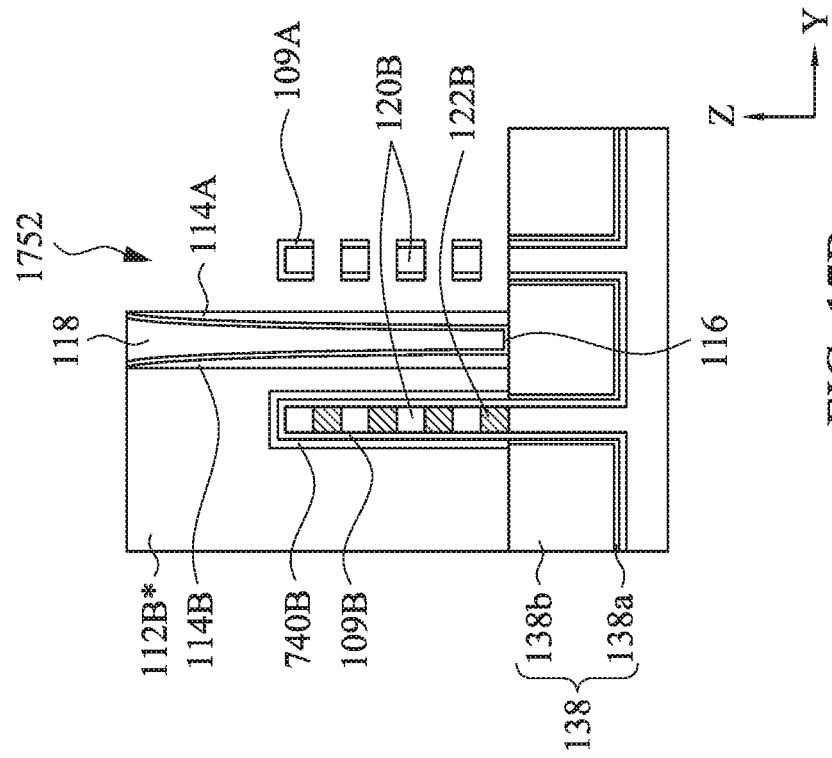
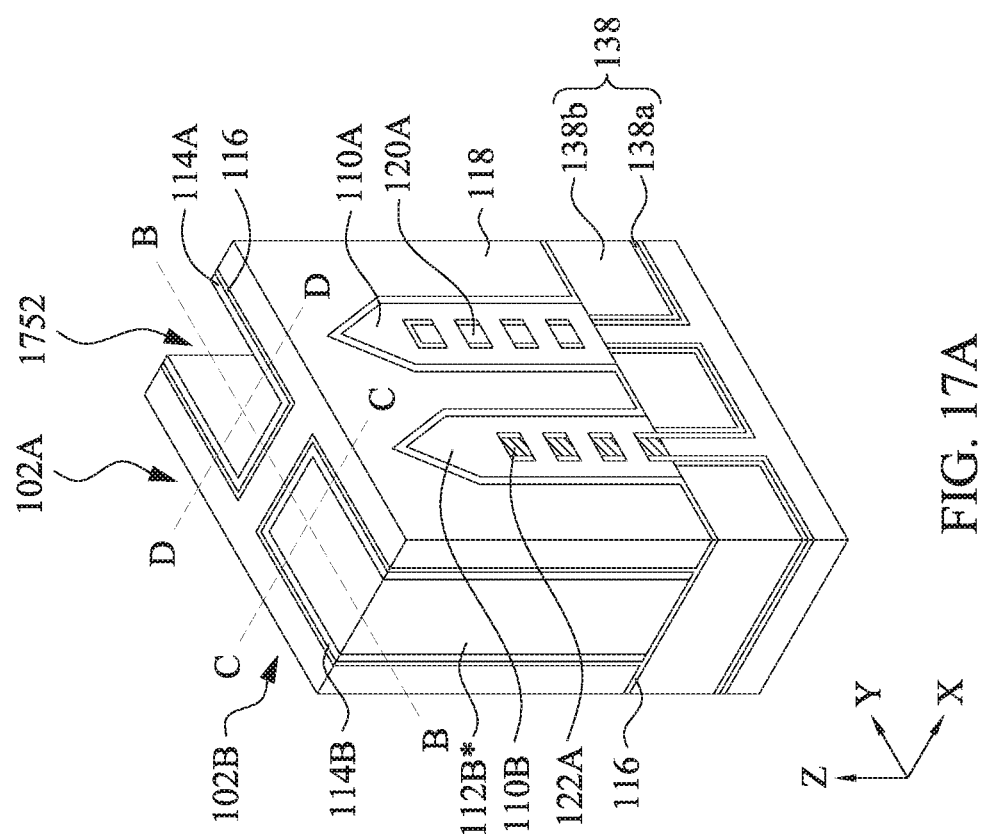
FIG. 17B
FIG. 17A

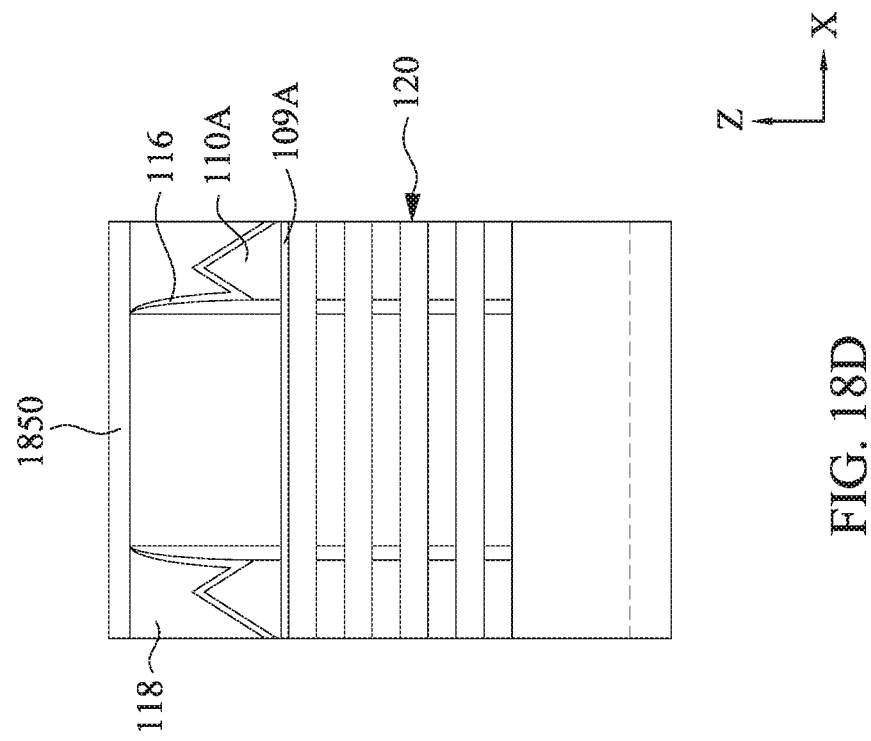
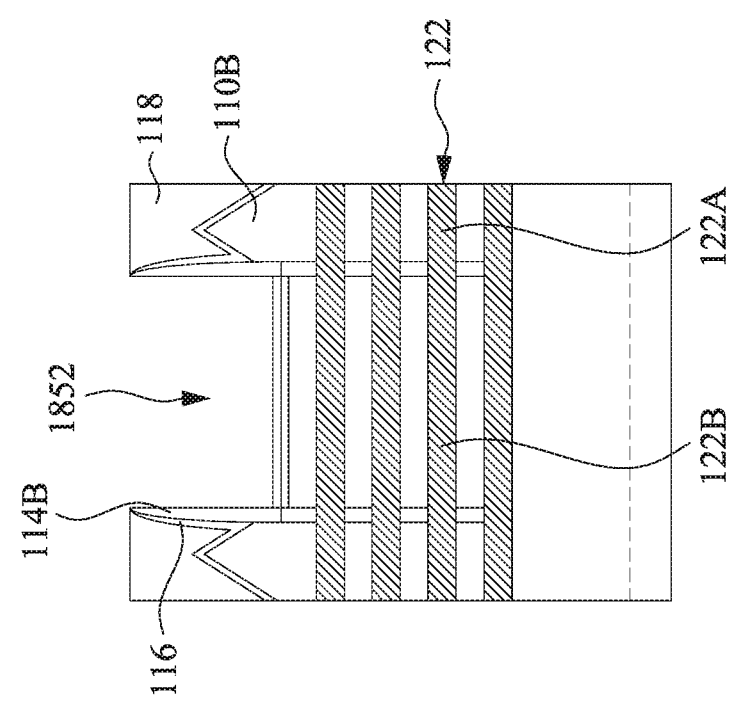
FIG. 18D
FIG. 18C

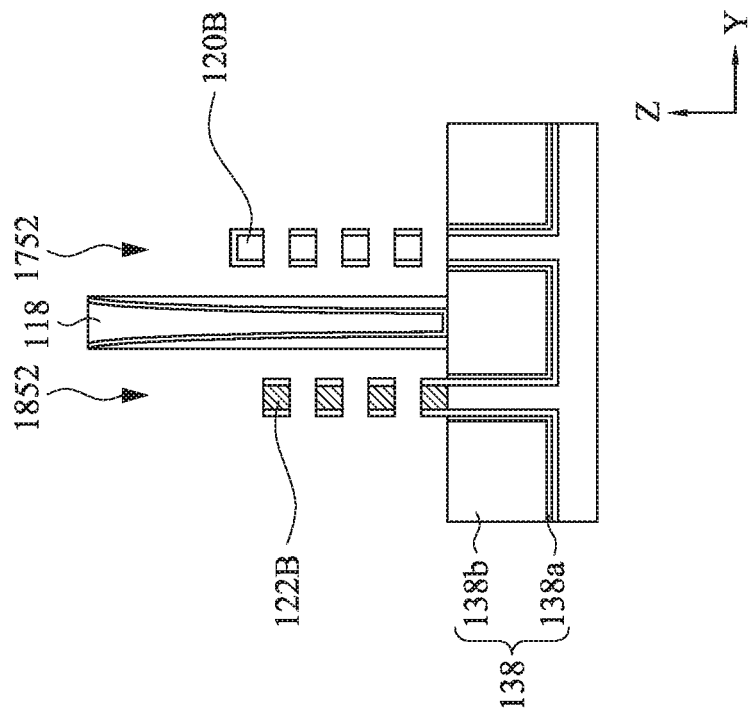
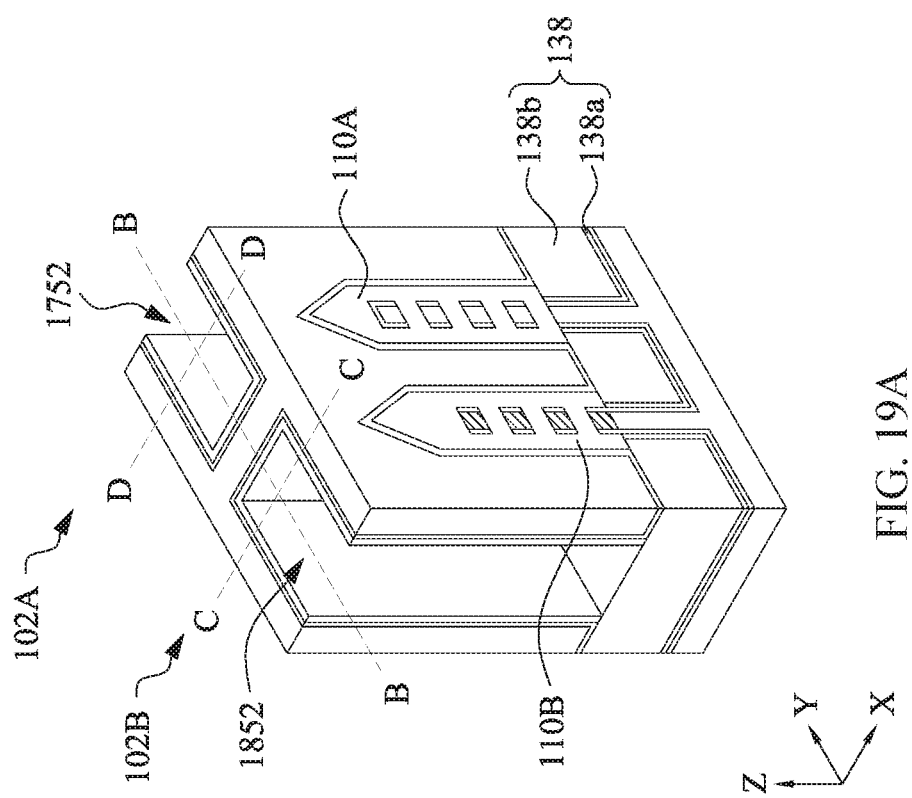
FIG. 19B
FIG. 19A

SPACER STRUCTURES FOR SEMICONDUCTOR DEVICES

BACKGROUND

With advances in semiconductor technology, there has been increasing demand for higher storage capacity, faster processing systems, and higher performance. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 4A-19A illustrate isometric views of a semiconductor device with inner and outer spacer structures at various stages of its fabrication process, in accordance with some embodiments.

FIGS. 4B-19B, 9C-19C, and 9D-19D illustrate cross-sectional views of a semiconductor device with inner and outer spacer structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1B:
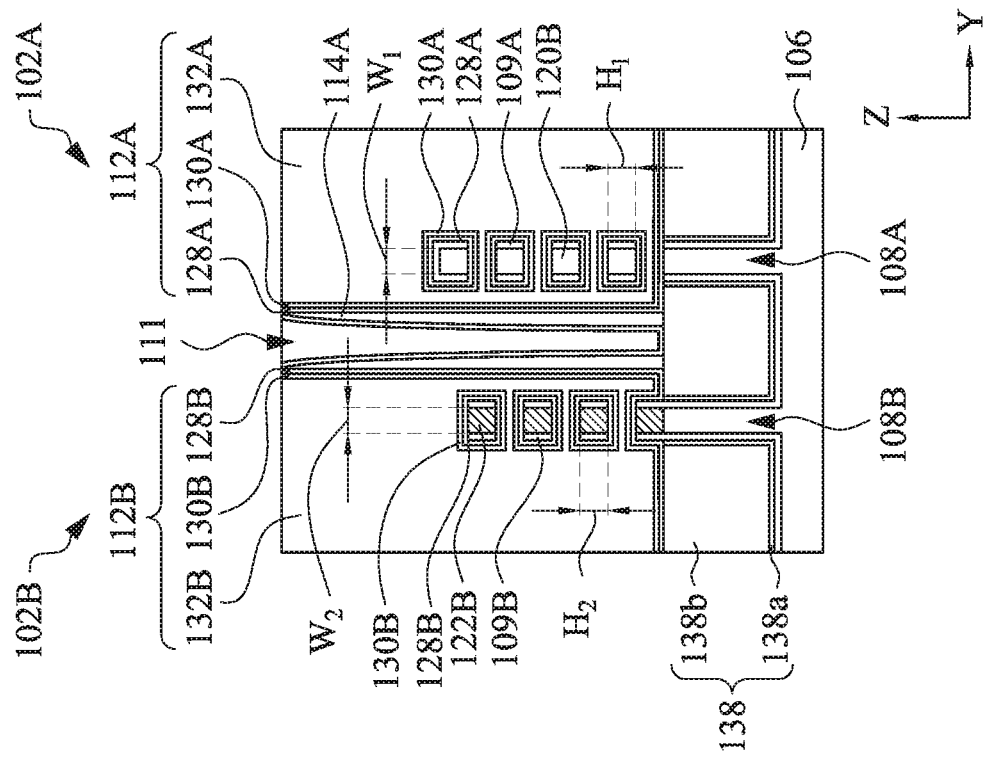
FIGS. 1A and 1B-1D illustrate an isometric view and cross-sectional views of a semiconductor device with inner and outer spacer structures, respectively, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "deposition selectivity" refers to the ratio of the deposition rates on two different materials or surfaces under the same deposition conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

In some embodiments, the terms "about" and "substantially" can indicate a value of a given quantity that varies within 5% of the value (e.g., ±1%, ±2%, ±3%, ±4%, ±5% of the value). These values are, of course, merely examples and are not intended to be limiting. It is to be understood that the terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example structures and methods for reducing parasitic capacitance in FET devices (e.g., finFETs, gate-all-around FETs, etc.). Reducing parasitic capacitance in FET devices can improve FET device performance.

The example structures and methods disclosed herein provide inner spacer structures between source/drain (S/D) regions and gate structures of FET devices to reduce parasitic capacitance between them. The parasitic capacitance can arise from capacitive coupling between the S/D regions and gate structures during FET operation and can negatively impact FET device performance (e.g., at high frequencies). In some embodiments, the inner spacer structures can be disposed between epitaxial S/D regions and gate-all-around (GAA) structures of the FET devices and can include low-k dielectric materials or gases. The inner spacer structures described herein can reduce the parasitic capacitance between the S/D regions and gate structures of the FET devices by, for example, about 20% to about 60% compared to the parasitic capacitance in FET devices without such inner spacer structures.

Figure 1A:
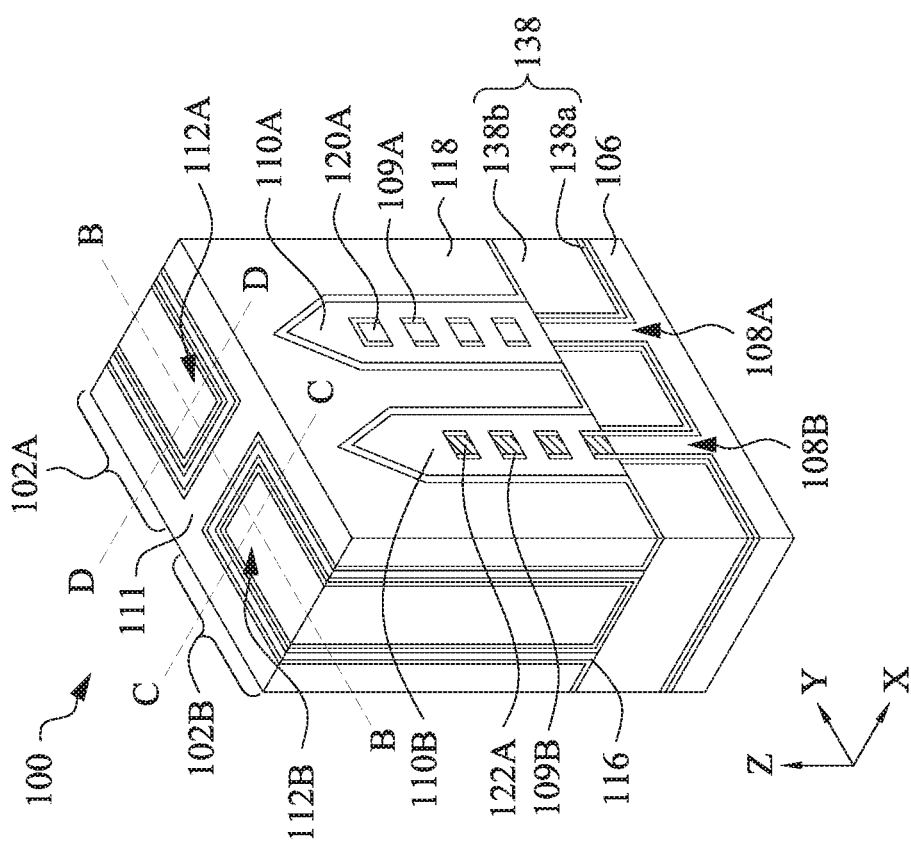
Figure 1D:
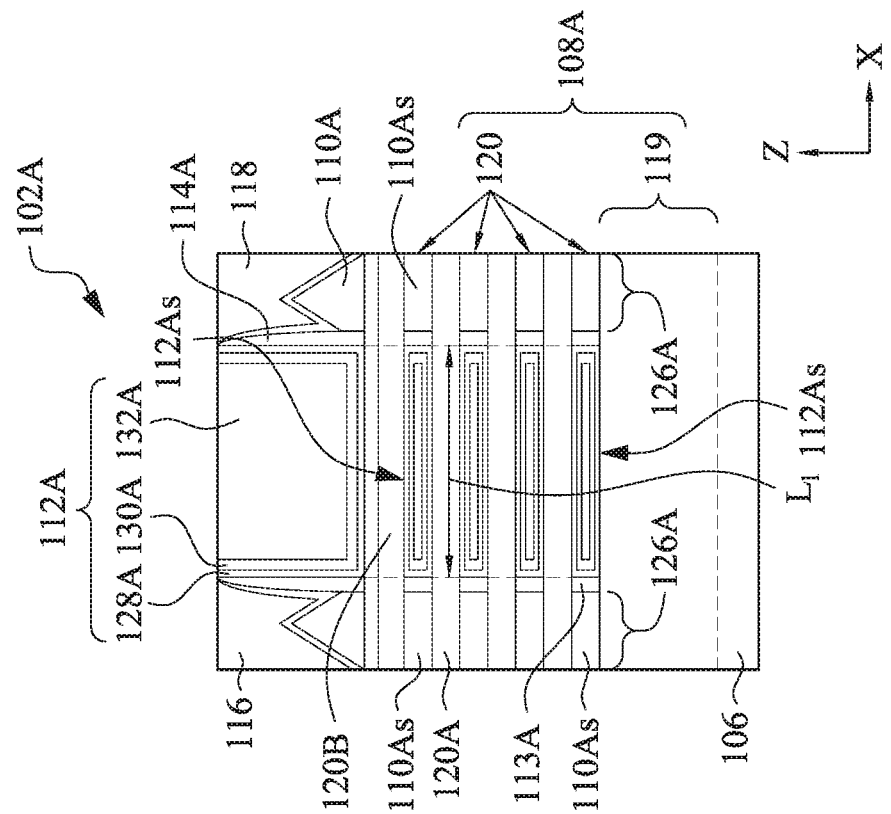
Figure 1C:
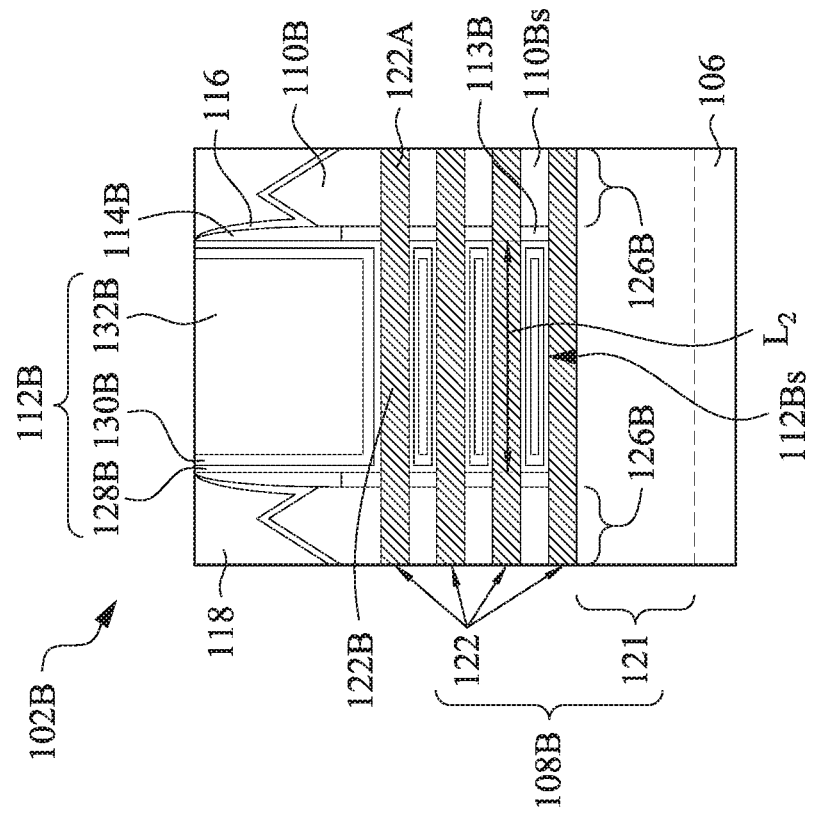

A semiconductor device 100 having FETs 102A-102B is described with reference to FIGS. 1A-1D, according to some embodiments. FIG. 1A illustrates an isometric view of semiconductor device 100, according to some embodiments. FIG. 1B-1D illustrate cross-sectional views along lines B-B, C-C, and D-D of semiconductor device 100 of FIG. 1A, respectively, according to some embodiments. In some embodiments, FETs 102A-102B can be both p-type FETs or n-type FETs or one of each conductivity type FETs. Even though two FETs are discussed with reference to FIGS. 1A-1D, semiconductor device 100 can have any number of FETs. The discussion of elements of FETs 102A-102B with the same annotations applies to each other, unless mentioned otherwise. The isometric view and cross-sectional views of semiconductor device 100 are shown for illustration purposes and may not be drawn to scale.

Referring to FIGS. 1A-1D, FETs 102A-102B can be formed on a substrate 106. Substrate 106 can be a semiconductor material such as, but not limited to, silicon. In some embodiments, substrate 106 can include a crystalline silicon substrate (e.g., wafer). In some embodiments, substrate 106 can include (i) an elementary semiconductor, such as germanium (Ge); (ii) a compound semiconductor including silicon carbide, gallium arsenide, gallium phosphide, indium phosphide, indium arsenide, indium antimonide, and/or a III-V semiconductor material; (iii) an alloy semiconductor including silicon germanium (SiGe), silicon germanium carbide, germanium stannum, silicon germanium stannum, gallium arsenic phosphide, gallium indium phosphide, gallium indium arsenide, gallium indium arsenic phosphide, aluminum indium arsenide, and/or aluminum gallium arsenide; (iv) a silicon-on-insulator (SOI) structure; (v) a silicon germanium (SiGe)-on insulator structure (SiGeOI); (vi) germanium-on-insulator (GeOI) structure; or (vii) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

FETs 102A-102B can include fin structures 108A-108B, passivation layers 109A-109B, epitaxial fin regions 110A-110B, gate structures 112A-112B (also referred to as gate-all-around (GAA) structures 112A-112B), inner spacers 113A-113B, and outer spacers 114A-114B, respectively.

As shown in FIGS. 1C-1D, fin structure 108A can include a fin base portion 119 and a stack of first semiconductor layers 120 disposed on fin base portion 119 and fin structure 108B can include a fin base portion 121 and a stack of second semiconductor layers 122. In some embodiments, fin base portions 119 and 121 can include material similar to substrate 106. Fin base portions 119 and 121 can be formed from a photolithographic patterning and an etching of substrate 106. Each of first semiconductor layers 120 can have (i) nanostructured regions 120A wrapped around by epitaxial fin regions 110A and underlying inner and outer spacers 113A-114A (FIGS. 1A and 1D), and (ii) nanostructured regions 120B wrapped around by gate structure 112A (FIGS. 1B and 1D). Similarly, each of second semiconductor layers 122 can have (i) nanostructured regions 122A wrapped around by epitaxial fin regions 110B and underlying inner and outer spacers 113B-114B (FIGS. 1A and 1C), and (ii) nanostructured regions 122B wrapped around by gate structure 112B (FIGS. 1B and 1C). Nanostructured regions 120B and 122B can be referred to as nanostructured channel regions 120B and 122B of FETs 102A-102B after the removal of nanostructured regions 122B and 120B (not shown in FIGS. 1A-1D; shown in FIGS. 16A-16D) to form gate structures 112A-112B, respectively.

First and second semiconductor layers 120 and 122 can include semiconductor materials different from each other. In some embodiments, first and second semiconductor layers 120 and 122 can include semiconductor materials with oxidation rates and/or etch selectivity different from each other. In some embodiments, first and second semiconductor layers 120 and 122 can include semiconductor materials similar to or different from substrate 106. First and second semiconductor layers 120 and 122 can include (i) an elementary semiconductor, such as silicon or germanium; (ii) a compound semiconductor including a III-V semiconductor material; (iii) an alloy semiconductor including SiGe, germanium stannum, or silicon germanium stannum; or (iv) a combination thereof. In some embodiments, first and second semiconductor layers 120 and 122 can include SiGe with Ge in a range from about 25 atomic percent to about 50 atomic percent with any remaining atomic percent being Si or can include Si without any substantial amount of Ge (e.g., with no Ge). The semiconductor materials of first and/or second semiconductor layers 120 and 122 can be undoped or can be in-situ doped during their epitaxial growth process using: (i) p-type dopants, such as boron, indium, or gallium; and/or (ii) n-type dopants, such as phosphorus or arsenic. In some embodiments, first semiconductor layers 120 can include Si for n-type FET 102A and SiGe for p-type FET 102B or first semiconductor layers 120 can include SiGe for p-type FET 102A and Si for n-type FET 102B if semiconductor device 100 is a complementary metal oxide semiconductor (CMOS) device. In some embodiments, both first and semiconductor layers 120 and 122 can include Si for n-type FETs 102A-102B or SiGe for p-type FETs 102A-102B.

Referring to FIG. 1B, nanostructured channel regions 120B and 122B can have respective vertical dimensions $H_1$ and $H_2$ (e.g., thickness or diameter) along a Z-axis ranging from about 5 nm to about 30 nm and respective horizontal dimensions $W_1$ and $W_2$ (e.g., width or diameter) along a Y-axis ranging from about 5 nm to about 30 nm. The ratios of $H_1/W_1$ and $H_2/W_2$ can each range from about 0.2 to about 5. Though rectangular cross-sections of nanostructured channel regions 120B and 122B are shown in FIG. 1B, nanostructured channel regions 120B and 122B can have cross-sections of other geometric shapes (e.g., circular, elliptical, triangular, or polygonal). Further, nanostructured channel regions 120B and 122B can have respective horizontal dimensions $L_1$ (FIG. 1D) and $L_2$ (FIG. 1C) along an X-axis ranging from about 10 nm to about 100 nm. The ratios of $L_1/H_1$ and $L_2/H_2$ can range from about 2 to about 20. In some embodiments, dimensions $H_1$ and $H_2$, $W_1$ and $W_2$, and $L_1$ and $L_2$ can be equal to or different from each other, respectively. In some embodiments, the ratios of $H_1/W_1$ and $H_2/W_2$, and $L_1/H_1$ and $L_2/H_2$ can be equal to or different from each other, respectively.

Referring to FIGS. 1A-1B, passivation layers 109A-109B can be disposed on sidewalls of nanostructured channel regions 120B and 122B and on sidewalls of fin base portions 119 and 121, respectively. In some embodiments, passivation layer 109A can be disposed on top surface of the top most first semiconductor layer 120, as shown in FIG. 1D. Passivation layers 109B are not disposed on second semiconductor layer as shown in FIG. 1C because portions of passivation layers 109B are removed during formation of FET 102B as described below. Passivation layers 109A-109B can improve the surface quality of these passivation layer covered surfaces of fin structures 108A-108B by reducing or eliminating dangling bond induced vacancies on these surfaces. The vacancies can trap charge carriers and reduce the drive currents of FETs 102A-102B during their operation. Reducing or eliminating these vacancies can increase the drive currents of FETs 102A-102B by about 20% to about 50% compared to FETs without passivation layers such as passivation layers 109A-109B.

In some embodiments, passivation layers 109A-109B can be a nitride, oxide, fluoride, chloride, and/or sulfide film. In some embodiments, passivation layers 109A-109B can include fluorine, chlorine, nitrogen, oxygen, hydrogen, deuterium, and/or sulfur atoms that can bond with the dangling bonds to reduce or eliminate the vacancies on the above mentioned surfaces of fin structures 108A-108B. Passivation layers 109A-109B can be substantially conformally deposited on these surfaces of fin structures 108A-108B and can have a thickness ranging from about 0.5 nm to about 5 nm.

Figure 1E:
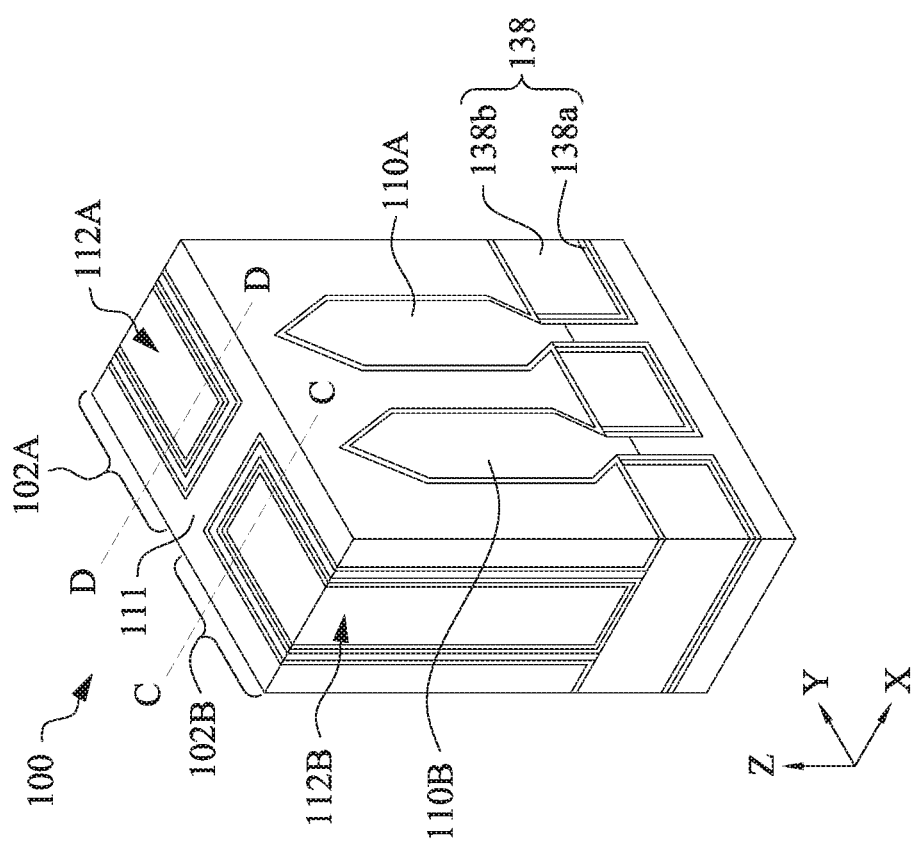
FIGS. 1E and 1F-1G illustrate an isometric view and cross-sectional views of a semiconductor device with passivation layers, respectively, in accordance with some embodiments.
Figure 1G:
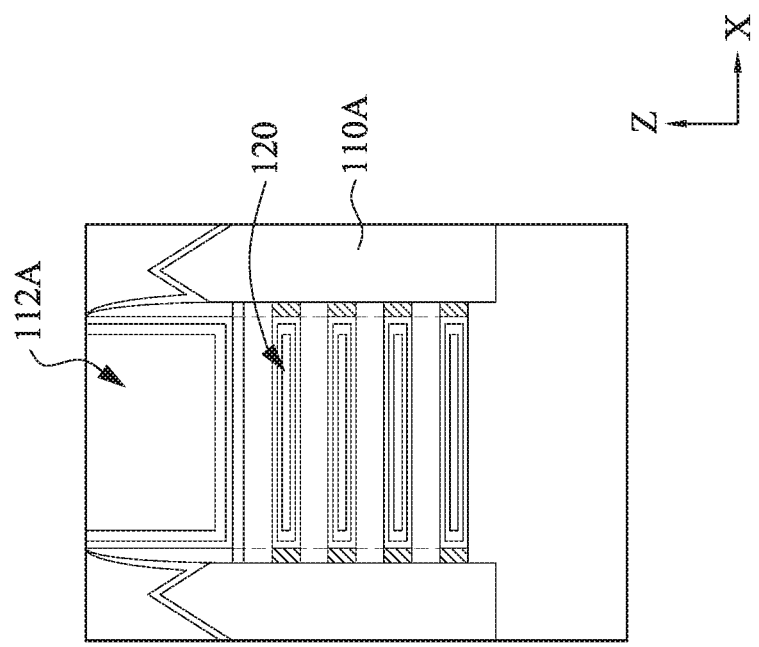
Figure 1F:
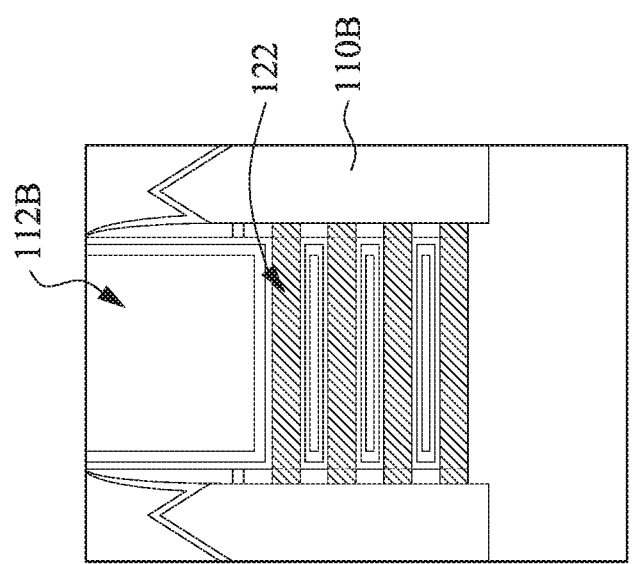

Referring to FIGS. 1A and 1C-1D, epitaxial fin regions 110A can be grown wrapped around nanostructured regions 120A that are not under inner or outer spacers 113A-114A. Similarly, epitaxial fin regions 110B can be grown wrapped around nanostructured regions 122A that are not under inner or outer spacers 113B-114B. In some embodiment, as shown in FIGS. 1E-1G, epitaxial fin regions 110B and 110A can be grown on fin base portions 121 and 119, instead of being wrapped around nanostructured regions 122A and 120A, respectively. Epitaxial fin regions 110A-110B can include epitaxially-grown semiconductor materials similar to or different from each other. In some embodiments, the epitaxially-grown semiconductor material can include the same material or a different material from the material of substrate 106. Epitaxial fin regions 110A-110B can each have a thickness along sidewalls of respective nanostructured regions 120A and 122A ranging from about 3 nm to about 6 nm. Though triangular cross-sections of epitaxial fin regions 110A-110B are shown in FIGS. 1C-1D, epitaxial fin regions 110A-110B can have cross-sections of other geometric shapes (e.g., rectangular, semicircular, or polygonal).

Epitaxial fin regions 110A-110B can be p-type for p-type FETs 102A-102B or n-type for n-type NFETs 102A-102B, respectively. In some embodiments, epitaxial fin regions 110A-110B can be the opposite doping type with respect to each other if semiconductor device 100 is a CMOS device. P-type epitaxial fin regions 110A-110B can include SiGe, SiGeB, GeB, SiGeSnB, a III-V semiconductor compound, or a combination thereof and a dopant concentration ranging from about $1 \times 10^{20}$ atoms/cm$^3$ to about $1 \times 10^{21}$ atoms/cm$^3$. In some embodiments, each of p-type epitaxial fin regions 110A-110B can have a plurality of sub-regions (not shown) that can include SiGe and can differ from each other based on, for example, doping concentration, epitaxial growth process conditions and/or relative concentration of Ge with respect to Si. Each of the sub-regions can have thicknesses similar to or different from each other and thicknesses can range from about 0.5 nm to about 5 nm. In some embodiments, the atomic percent Ge in a first sub-region can be smaller than the atomic percent Ge in a second sub-region. In some embodiments, the first sub-region can include Ge in a range from about 15 atomic percent to about 35 atomic percent, while the second sub-region can include Ge in a range from about 25 atomic percent to about 50 atomic percent with any remaining atomic percent being Si in the sub-regions.

The plurality of sub-regions of p-type epitaxial fin regions 110A-110B can have varying p-type dopant concentrations with respect to each other, according to some embodiments. For example, the first sub-region can be undoped or can have a dopant concentration lower (e.g., dopant concentration less than about $8 \times 10^{20}$ atoms/cm$^3$) than the dopant concentration (e.g., dopant concentration in a range from about $1 \times 10^{20}$ to about $3 \times 10^{22}$ atoms/cm$^3$) of the second sub-region.

In some embodiments, n-type epitaxial fin regions 110A-110B can have a plurality of n-type sub-regions (not shown). First n-type sub-regions can have materials with SiAs, SiC, or SiCP, a dopant concentration ranging from about $1 \times 10^{20}$ atoms/cm$^3$ to about $1 \times 10^{21}$ atoms/cm$^3$ and a thickness ranging from about 1 nm to about 3 nm. Second n-type sub-regions disposed on the first n-type sub-regions can have materials with SiP and a dopant concentration ranging from about $1 \times 10^{20}$ atoms/cm$^3$ to about $1 \times 10^{22}$ atoms/cm$^3$. Third n-type sub-regions disposed on the second n-type sub-regions can have materials with material compositions and thicknesses similar to the first n-type sub-regions.

Epitaxial fin regions 110A-110B along with their underlying nanostructured regions 120A and 122A can form source/drain (S/D) regions 126A-126B, respectively. Nanostructured channel regions 120B and 122B can be interposed between a pair of S/D regions 126A-126B, respectively, as shown in FIGS. 1C-1D.

Gate structures 112A-112B can be multi-layered structures and can be wrapped around nanostructured channel regions 120B and 122B, respectively, for which gate structures 112A-112B can be referred to as gate-all-around (GAA) structures or horizontal gate-all-around (HGAA) structures, and FETs 102A-102B can be referred to as GAA FETs 102A-102B. Spacing 111 between gate structures 112A-112B is not drawn to scale and gate structures 112A-112B can be separated from each other by any distance. In some embodiments, FETs 102A-102B can have a common gate structure wrapped around nanostructured channel regions 120B and 122B similar to gate structures 112A-112B.

Gate structures 112A-112B can include gate dielectric layers 128A-128B, gate work function metal layers 130A-130B, and gate metal fill layers 132A-132B, respectively. As shown in FIG. 1B, gate dielectric layer 128A can be wrapped around each of nanostructured channel regions 120B to fill the spaces between adjacent nanostructured channel regions 120B, and thus electrically isolate nanostructured channel regions 120B from each other and from conductive gate work function metal layer 130A and gate metal fill layer 132A to prevent shorting between gate structure 112A and S/D regions 126A during FET 102A's operation. Similarly, gate dielectric layer 128B can be wrapped around each of nanostructured channel regions 122B to fill the spaces between adjacent nanostructured channel regions 122B and electrically isolate nanostructured channel regions 122B from each other and from conductive gate work function metal layer 130B and gate metal fill layer 132B to prevent shorting between gate structure 112B and S/D regions 126 during FET 102B's operation.

Each of gate dielectric layers 128A-128B can have a thickness ranging from about 1 nm to about 5 nm and can include (i) a layer of silicon oxide, silicon nitride, and/or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof.

As shown in FIG. 1B, one or more of nanostructured channel regions 120B and 122B can be wrapped around with gate work function metal layers 130A-130B and gate metal fill layers 132A-132B. Gate work function metal layers 130A-130B can include a single metal layer or a stack of metal layers. The stack of metal layers can include metals having work function values equal to or different from each other. In some embodiments, each of gate work function metal layers 130A-130B can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, each gate work function layer 130 can include Al-doped metal, such as Al-doped Ti, Al-doped TiN, Al-doped Ta, or Al-doped TaN. In some embodiments, each gate work function layer 130 can have a thickness ranging from about 2 nm to about 15 nm.

In some embodiments, gate barrier layers (not shown) can be disposed between gate dielectric layers 128A-128B and gate work function metal layers 130A-130B, respectively. Gate barrier layers can serve as nucleation layers for subsequent formation of gate work function layers 130A-130B and/or can help to prevent substantial diffusion of metals (e.g., Al) from gate work function layers 130A-130B to underlying layers (e.g., gate dielectric layers 128A-128B). Gate barrier layers can include titanium (Ti), tantalum (Ta), titanium nitride (TiN), tantalum nitride (TaN), or other suitable diffusion barrier materials. In some embodiments, gate barrier layers can include substantially fluorine-free metal or metal-containing films. The substantially fluorine-free metal or fluorine-free metal-containing film can include an amount of fluorine contaminants less than 5 atomic percent in the form of ions, atoms, and/or molecules. In some embodiments, gate barrier layers can have a thickness ranging from about 1 nm to about 10 nm.

Each of gate metal fill layers 132A-132B can include a single metal layer or a stack of metal layers. The stack of metal layers can include metals different from each other. In some embodiments, each of gate metal fill layers 132A-132B can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. Though gate structures 112A-112B are shown to be similar, FETs 102A-102B can have gate structures with materials and/or electrical properties (e.g., threshold voltage, work function value) different from each other. Also, though gate structures 112A-112B are shown to have GAA structures, other gate structures (e.g., vertical GAA structures or gate structures without GAA structures) are within the scope and spirit of this disclosure.

As shown in FIGS. 1C-1D, each of inner spacers 113A can be disposed between a sub-region 110As of epitaxial regions 110A and a sub-region 112As of gate structure 112A and each of inner spacers 113B can be disposed between a sub-region 110Bs of epitaxial regions 110B and a sub-region 112Bs of gate structure 112B. Each of inner spacers 113A-113B can prevent capacitive coupling between sub-regions 110As and 112As and between sub-regions 110Bs and 112Bs, respectively. Preventing capacitive coupling between these sub-regions can reduce parasitic capacitance between S/D regions 126A-126B and gate structures 112A-112B and improve device performance of FETs 102A-102B.

In some embodiments, inner spacers 113A-113B can include a low-k dielectric material with a dielectric constant less than about 3.9 and/or between about 1 to about 3.5. In some embodiments, the low-k dielectric material can include silicon, oxygen, carbon, and/or nitrogen. The concentrations of silicon, oxygen, carbon, and nitrogen in the low-k dielectric material for inner spacers 113A-113B can depend on the desired dielectric constant of inner spacers 113A-113B. Varying concentrations of silicon, oxygen, carbon, and nitrogen in the low-k dielectric material can vary the desired dielectric constant. The low-k dielectric material can include silicon oxycarbonitride (SiOCN), silicon carbon nitride (SiCN), silicon oxide carbide (SiOC), polymides, carbon-doped oxides, fluorine-doped oxides, hydrogen-doped oxides, or a combination thereof.

In some embodiments, inner spacers 113A-113B can include a low-k dielectric gas with a dielectric constant less than about 3.9 and/or between about 0.5 to about 3.5. The low-k dielectric gas can include air, nitrogen, helium, argon, hydrogen, or other suitable dielectric gases. In some embodiments, inner spacers 113A-113B can be in the form of airgaps between sub-regions 110As and 112As and between sub-regions 110Bs and 112Bs, respectively. In some embodiments, inner spacers 113A-113B can have material similar to or different from each other. In some embodiments, both FETs 102A-102B can have inner spacers, such as inner spacers 113A-113B or one of FETs 102A-102B can have inner spacers, such as inner spacers 113A or 113B. Though rectangular cross-sections of inner spacers 113A-113B are shown in FIGS. 1C-1D, nanostructured channel regions 120B and 122B can have cross-sections of other geometric shapes (e.g., semicircular, triangular, or polygonal). In some embodiments, each of inner spacers 113A-113B can have a horizontal dimension (e.g., thickness) along an X-axis ranging from about 3 nm to about 15 nm.

Outer spacers 114A-114B can be disposed on sidewalls of respective gate structures 112A-112B and be in physical contact with respective gate dielectric layers 128A-128B, according to some embodiments. Outer spacers 114A-114B can include an insulating material, such as silicon oxide, silicon nitride, silicon carbon nitride (SiCN), silicon oxycarbon nitride (SiOCN), a low-k material, or a combination thereof. Outer spacers 114A-114B can have a low-k material with a dielectric constant less than about 3.9 and/or between about 1 to about 3.5. In some embodiments, each of outer spacers 114A-114B can have a thickness ranging from about 2 nm to about 10 nm. In some embodiments, a horizontal distance between outer spacers 114A along an X-axis is greater than a horizontal distance between inner spacers 113A along an X-axis. Similarly, a horizontal distance between outer spacers 114B along an X-axis is greater than a horizontal distance between inner spacers 113B along an X-axis FETs 102A-102B can be incorporated into an integrated circuit through the use of other structural components, such as gate contact structures, S/D contact structures, conductive vias, conductive lines, interconnect metal layers, etc., which are not shown herein for the sake of clarity.

Referring to FIGS. 1A-1D, semiconductor device 100 can further include etch stop layer (ESL) 116, interlayer dielectric (ILD) layer 118, and shallow trench isolation (STI) regions 138. ESL 116 can be disposed on sidewalls of outer spacers 114A-114B and on epitaxial regions 110A-110B. ESL 116 can be configured to protect gate structures 112A-112B and/or S/D regions 126A-126B. This protection can be provided, for example, during the formation of ILD layer 118 and/or S/D contact structures (not shown). In some embodiments, ESL 116 can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESL 116 can have a thickness ranging from about 3 nm to about 30 nm.

ILD layer 118 can be disposed on ESL 116 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). In some embodiments, the dielectric material is silicon oxide. In some embodiments, ILD layer 118 can have a thickness in a range from about 50 nm to about 200 nm.

STI regions 138 can be configured to provide electrical isolation between FETs 102A-102B and neighboring FETs (not shown) on substrate 106 and/or neighboring active and passive elements (not shown) integrated with or deposited on substrate 106. In some embodiments, STI regions 138 can include a plurality of layers, such as a nitride layer and/or oxide layer 138A and an insulating layer disposed on nitride and/or oxide layers 138A. In some embodiments, the nitride and/or oxide layers 138A can prevent oxidation of the sidewalls of fin top portions 108A2-108B2 during the formation of STI regions 138. In some embodiments, insulating layer 138B can include silicon oxide, silicon nitride, silicon oxynitride, fluorine-doped silicate glass (FSG), a low-k dielectric material, and/or other suitable insulating materials. In some embodiments, STI regions 138 can have a vertical dimension along a Z-axis ranging from about 40 nm to about 200 nm.

Based on the disclosure herein, it will be recognized that cross-sectional shapes of semiconductor device 100 and its elements (e.g., fin structure 108A-108B, gate structures 112A-112B, epitaxial fin regions 110A-110B, inner spacers 113A-113B, outer spacers 114A-114B, and/or STI regions 138) are illustrative and are not intended to be limiting.

Figure 2B:
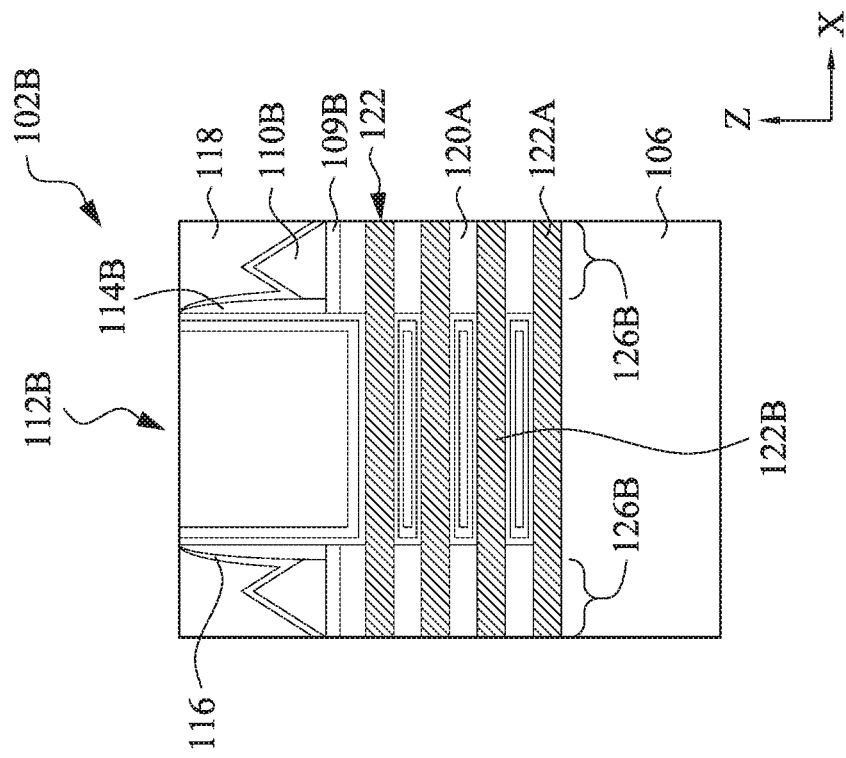
FIGS. 2A-2B illustrate cross-sectional views of different configurations of a semiconductor device, in accordance with some embodiments.
Figure 2A:
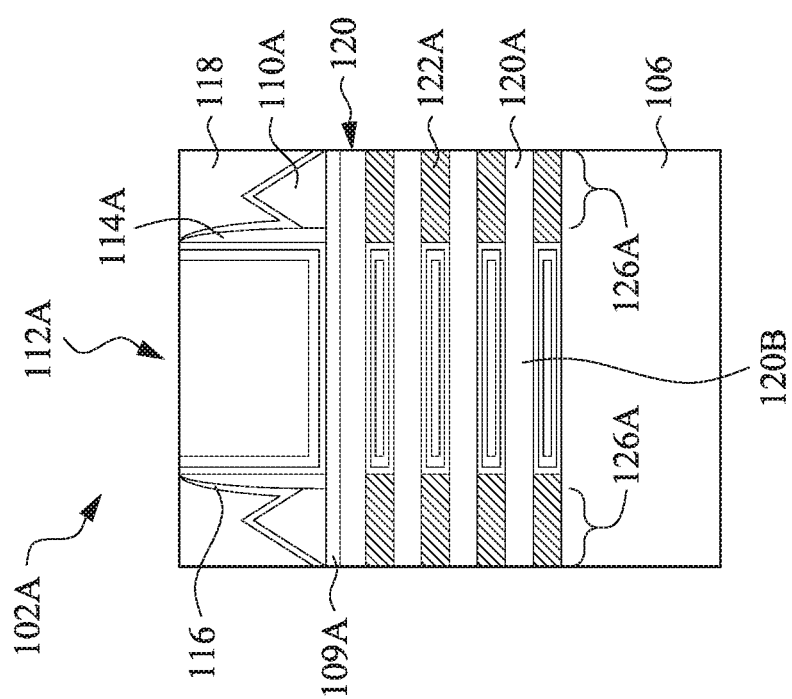

FIGS. 2A-2B illustrate cross-sectional views of FETs 102A-102B along lines D-D and C-C of FIG. 1A for a different configuration of S/D regions 126A-126B than that shown in FIGS. 1D and 1C, respectively. In some embodiments, instead of FET 102A shown in FIG. 1D, semiconductor device 100 can have FET 102A as shown in FIG. 2A. S/D regions 126A of FIG. 2A can include a stack of nanostructured regions 120A and 122A arranged in an alternating configuration instead of a stack of nanostructured regions 120A and sub-regions 110As arranged in an alternating configuration as shown in FIG. 1D. Similarly, in some embodiments, instead of FET 102B shown in FIG. 1C, semiconductor device 100 can have FET 102B as shown in FIG. 2B. S/D regions 126B of FIG. 2B can include a stack of nanostructured regions 120A and 122A arranged in an alternating configuration instead of a stack of nanostructured regions 122A and sub-regions 110Bs arranged in an alternating configuration as shown in FIG. 1C. FETs 102A-102B with S/D regions 126A-126B as shown in FIGS. 2A-2B may not have inner spacers, such as inner spacers 113A-113B.

Figure 3:
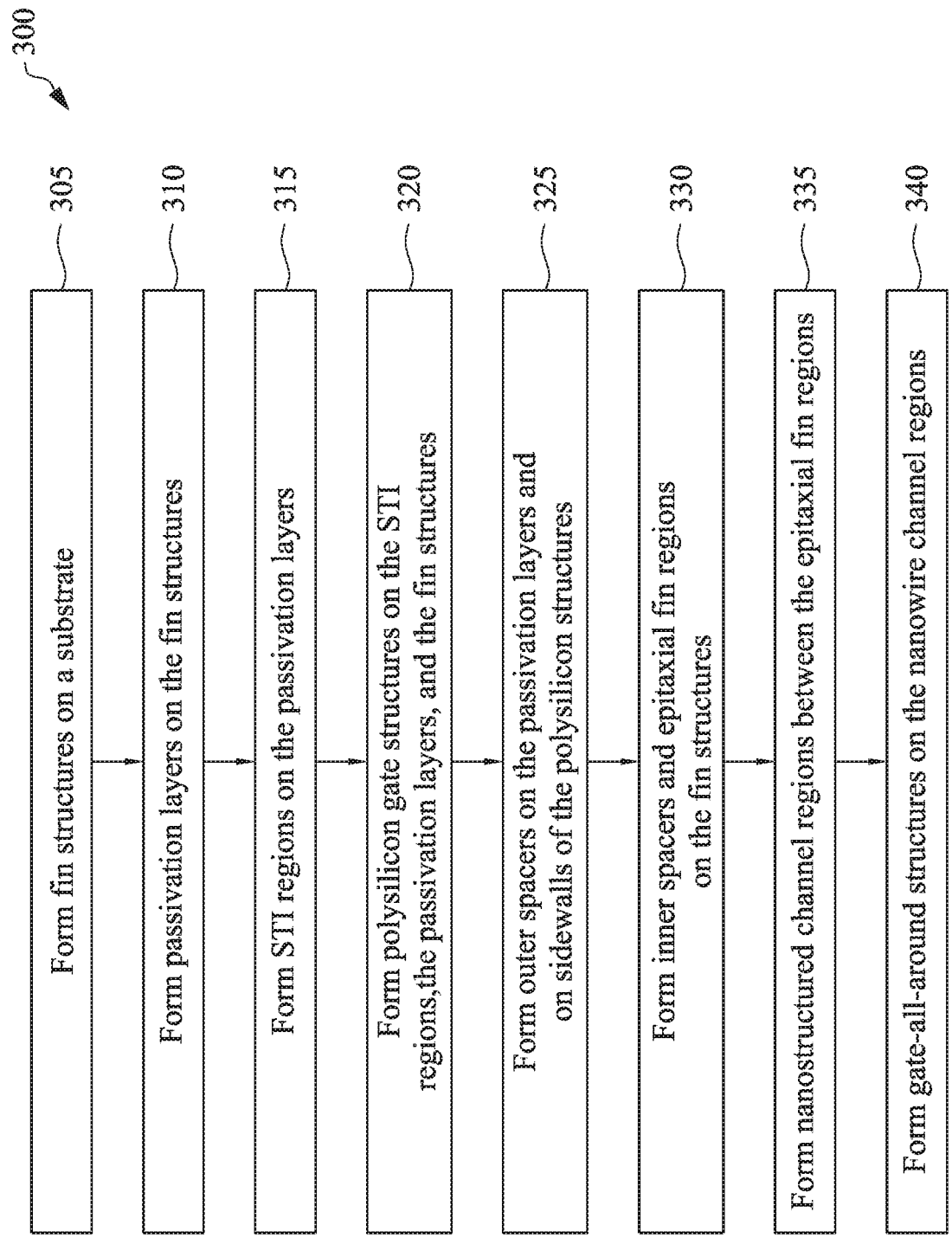
FIG. 3 is a flow diagram of a method for fabricating a semiconductor device with inner and outer spacer structures, in accordance with some embodiments.

FIG. 3 is a flow diagram of an example method 300 for fabricating semiconductor device 100, according to some embodiments. For illustrative purposes, the operations illustrated in FIG. 3 will be described with reference to the example fabrication process for fabricating semiconductor device 300 as illustrated in FIGS. 4A-19A, 4B-19B, 9C-19C, and 9D-19D. FIGS. 4A-19A are isometric views of semiconductor device 100 at various stages of its fabrication. FIGS. 4B-19B, 9C-19C, and 9D-19D are cross-sectional views along lines B-B, C-C, and D-D of structures of FIGS. 4A-19A, respectively, according to some embodiments. Operations can be performed in a different order or not performed depending on specific applications. It should be noted that method 300 may not produce a complete semiconductor device 100. Accordingly, it is understood that additional processes can be provided before, during, and after method 300, and that some other processes may only be briefly described herein. Elements in FIGS. 4A-19A, 4B-19B, 9C-19C, and 9D-19D with the same annotations as elements in FIGS. 1A-1D are described above.

Figure 4B:
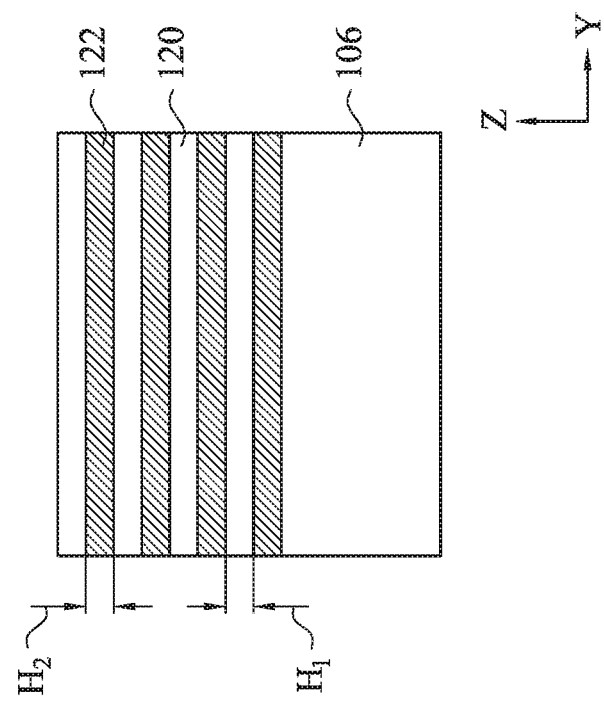
Figure 4A:
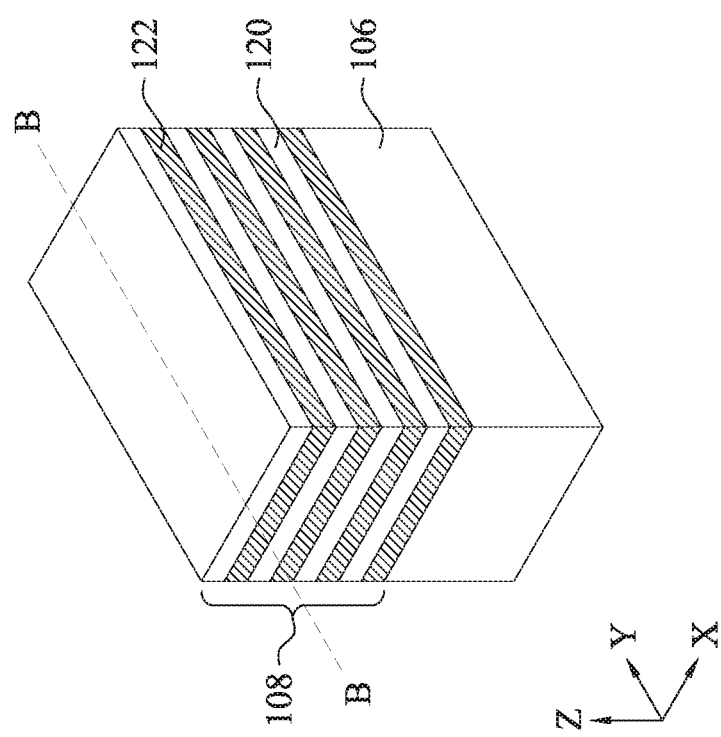

In operation 305, fin structures are formed on a substrate. For example, fin structures 108A*-108B* (shown in FIGS. 5A-5B) with fin base portions 119 and 121 and stacks of first and second semiconductor layers 120 and 122 arranged in alternating configurations can be formed on substrate 106 as described with reference to FIGS. 4A-5B. In subsequent processing, fin structures 108A*-108B* can form fin structures 108A-108B (shown in FIGS. 1A-1D) after the removal of second and first semiconductor layers 122 and 120 from fin structures 108A*-108B*, respectively. The process for forming fin structures 108A*-108B* can include forming a stacked layer 108* on substrate 106 as shown in FIGS. 4A-4B. Stacked layer 108* can include first and second semiconductor layers 120* and 122* stacked in an alternating configuration. First and second semiconductor layers 120* and 122* can have respective vertical dimensions $H_1$ and $H_2$ along a Z-axis ranging from about 5 nm to about 30 nm.

Each of first and second semiconductor layers 120\* and 122\* can be epitaxially grown on its underlying layer and can include semiconductor materials different from each other. In some embodiments, first and second semiconductor layers 120\* and 122\* can include semiconductor materials with oxidation rates and/or etch selectivity different from each other. In some embodiments, first and second semiconductor layers 120\* and 122\* can include semiconductor materials similar to or different from substrate 106. First and second semiconductor layers 120\* and 122\* can include (i) an elementary semiconductor, such as silicon or germanium; (ii) a compound semiconductor including a III-V semiconductor material; (iii) an alloy semiconductor including SiGe, germanium stannum, or silicon germanium stannum; or (iv) a combination thereof. In some embodiments, first semiconductor layers 120\* can include Si and second semiconductor layers 122\* can include SiGe. In some embodiments, first and second semiconductor layers 120\* and 122\* can include SiGe with Ge in a range from about 25 atomic percent to about 50 atomic percent with any remaining atomic percent being Si or can include Si without any substantial amount of Ge (e.g., with no Ge).

First and/or second semiconductor layers 120\* and 122\* can be undoped or can be in-situ doped during their epitaxial growth process using (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used.

The process for forming fin structures **108A\*-108B\* can further include etching the structure of FIG. 4A through patterned hard mask layers (not shown) formed on stacked layer 108\* of FIG. 4A. In some embodiments, hard mask layers can include layers of silicon oxide formed, for example, using a thermal oxidation process and/or layers of silicon nitride formed using, for example, low pressure chemical vapor deposition (LPCVD) or plasma enhanced CVD (PECVD). The etching of the structure of FIG. 4A** can include a dry etch, a wet etch process, or a combination thereof.

The dry etch process can include using etchants having an oxygen-containing gas, a fluorine-containing gas (e.g., $CF_4$, $SF_6$, $CH_2F_2$, $CHF_3$, $NF_3$, and/or $C_2F_6$), a chlorine-containing gas (e.g., $Cl_2$, $CHCl_3$, $CCl_4$, HCl, and/or $BCl_3$), a bromine-containing gas (e.g., HBr and/or $CHBR_3$), ammonia gas ($NH_3$), an iodine-containing gas, other suitable etching gases and/or plasmas, or combinations thereof. The dry etch process can be carried out at high bias voltage ranging from about 150 V to about 350 V, at a radio frequency power ranging from about 10 W to about 50 W, at a pressure of about 5 Torr to about 50 Torr, at a temperature ranging from about 25° C. to about 40° C., and for a time period ranging from about 10 sec to about 40 sec.

The wet etch process can include etching in diluted hydrofluoric acid (DHF), potassium hydroxide (KOH) solution, ammonia ($NH_3$), a solution containing hydrofluoric acid (HF), nitric acid ($HNO_3$), acetic acid ($CH_3COOH$), or combinations thereof.

Figure 5B:
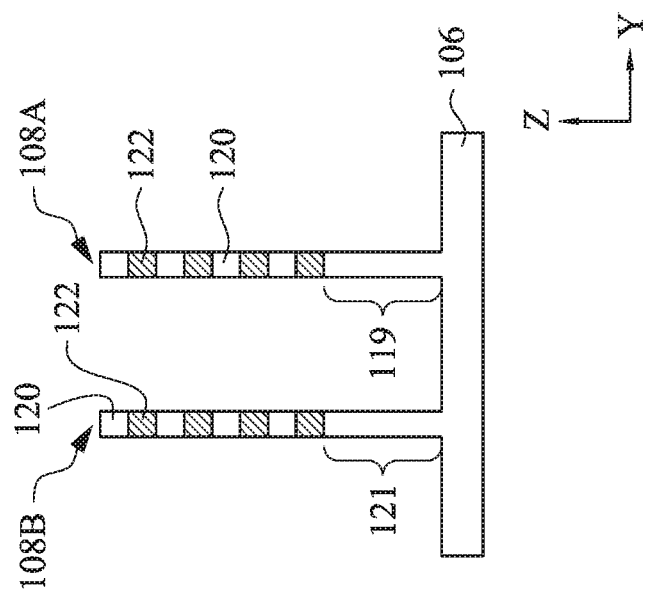
Figure 5A:
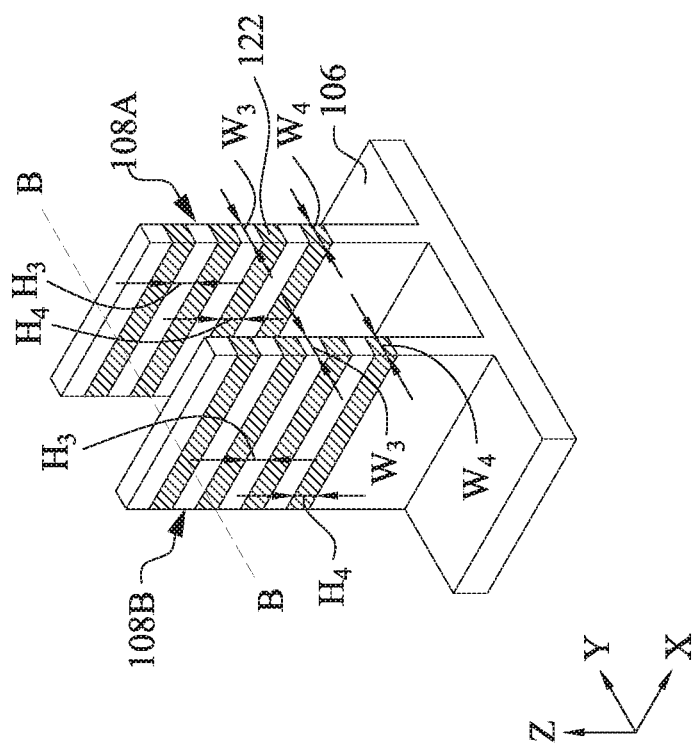

After the etching of stacked layer 108\*, fin structures **108A\*-108B\* with fin base portions 119 and 121 having respective vertical dimensions along a Z-axis ranging from about 40 nm to about 60 nm can be formed, as shown in FIGS. 5A-5B. Stacks of first and second semiconductor layers 120 and 122 formed on fin base portions 119 and 121** can have respective vertical dimensions $H_3$ and $H_4$ along a Z-axis ranging from about 5 nm to about 30 nm and respective horizontal dimensions $W_3$ and $W_4$ along a Y-axis ranging from about 5 nm to about 50 nm. The ratios of $H_1/W_1$ and $H_2/W_2$ can each range from about 0.2 to about 5. In some embodiments, dimensions $H_3$-$H_4$ and $W_3$-$W_4$ can be equal to or different from each other, respectively. In some embodiments, the ratios of $H_1/W_1$ and $H_2/W_2$ can be equal to or different from each other, respectively.

Referring to FIG. 3, in operation 310, passivation layers are formed on the fin structures. For example, passivation layers 109A-109B can be formed on fin structures **108A\*-108B\*, respectively, as described with reference to FIGS. 6A-6B. The process for forming passivation layers 109A-109B on fin structures 108A\*-108B\* can include blanket depositing a passivation layer 109 on the structure of FIG. 5A using one or more precursor gases having fluorine, chlorine, nitrogen, oxygen, hydrogen, deuterium, $NH_3$, and/or hydrogen sulfide ($H_2S$) in an ALD or CVD process. The one or more precursor gases can have a flow rate ranging from about 10 sccm to about 1500 sccm during the blanket deposition process. The blanket deposition process can be carried out at a pressure of about 10 Torr to about 20 atmospheric pressure, at a temperature ranging from about 100° C. to about 300° C., and for a time period ranging from about 10 sec to about 120 min. The portions of blanket deposited passivation layer 109 on fin structures 108A\*-108B\* can be referred to as passivation layers 109A-109B**, respectively.

Referring to FIG. 3, in operation 315, STI regions are formed on the passivation layers. For example, STI regions 138 can be formed on passivation layers 109A-109B, as described with reference to FIGS. 7A-7B. The formation of STI regions 138 can include (i) depositing a layer of nitride material (not shown) on the structure of FIG. 6A, (ii) depositing a layer of oxide material (not shown) on the layer of nitride material, (iii) depositing a layer of insulating material (not shown) on the layer of oxide material, (iv) annealing the layer of insulating material, (v) chemical mechanical polishing (CMP) the layers of nitride and oxide materials and the annealed layer of insulating material, and (vi) etching back the polished structure to form STI regions 138 of FIG. 7A.

The layers of nitride and oxide materials can be deposited using a suitable process for depositing oxide and nitride materials, such as ALD or CVD. In some embodiments, the layer of insulating material can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane (SiH4) and oxygen ($O_2$) as reacting precursors. In some embodiments, layer of insulating material can be formed using a sub-atmospheric CVD (SACVD) process or high aspect-ratio process (HARP), where process gases can include tetraethoxysilane (TEOS) and/or ozone ($O_3$).

In some embodiments, the layer of insulating material can be formed by depositing flowable silicon oxide using a flowable CVD (FCVD) process. The FCVD process can be followed by a wet anneal process. The wet anneal process can include annealing the deposited layer of insulating material in steam at a temperature in a range from about 200° C. to about 700° C. for a period in a range from about 30 min to about 120 min. The wet anneal process can be followed by the CMP process to remove portions of the layers of nitride, oxide, and insulating materials to substantially coplanarize top surfaces of the layers of nitride, oxide, and insulating materials with top surfaces of fin structures 108A*-108B*. The CMP process can be followed by the etching process to etch back the layers of nitride, oxide, and insulating materials to form STI regions 138 of FIG. 7A.

The etch back of the layers of nitride, oxide, and insulating materials can be performed by a dry etch process, a wet etch process, or a combination thereof. In some embodiments, the dry etch process can include using a plasma dry etch with a gas mixture having octafluorocyclobutane ($C_4F_8$), argon (Ar), oxygen ($O_2$), helium (He), fluoroform ($CHF_3$), carbon tetrafluoride ($CF_4$), difluoromethane ($CH_2F_2$), chlorine ($Cl_2$), hydrogen bromide (HBr), or a combination thereof with a pressure ranging from about 1 mTorr to about 5 mTorr. In some embodiments, the wet etch process can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process can include using ammonia ($NH_3$) and hydrofluoric acid (HF) as etchants and inert gases, such as Ar, xenon (Xe), He, or a combination thereof. In some embodiments, the flow rate of HF and $NH_3$ used in the wet etch process can each range from about 10 sccm to about 100 sccm. In some embodiments, the wet etch process can be performed at a pressure ranging from about 5 mTorr to about 100 mTorr and a high temperature ranging from about 50° C. to about 120° C.

Referring to FIG. 3, in operation 320, protective oxide layers are formed on the passivation layers and polysilicon structures are formed on the protective oxide layers and the STI regions. For example, protective oxide layers 740A-740B can be formed on respective passivation layers 109A-109B and polysilicon structures 112A*-112B* can be formed on respective protective oxide layer 740A-740B and STI regions 138, as described with reference to FIGS. 7A-7B.

Figure 6B:
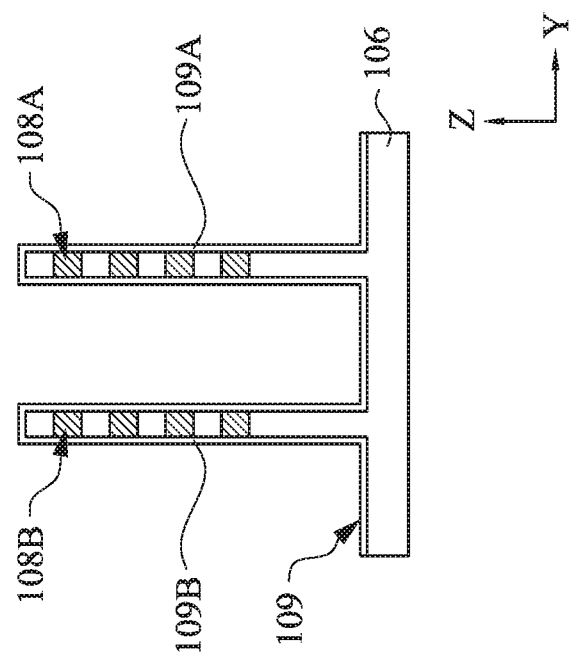
Figure 6A:
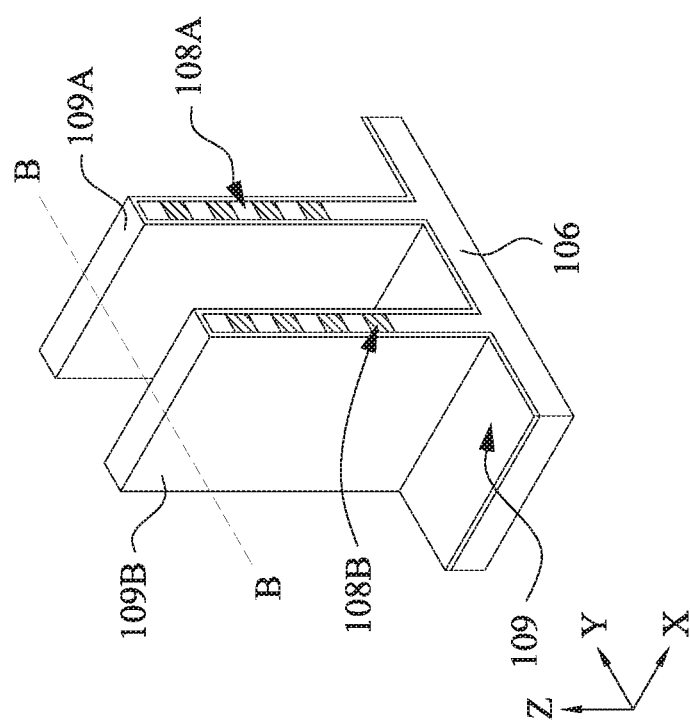
Figure 8B:
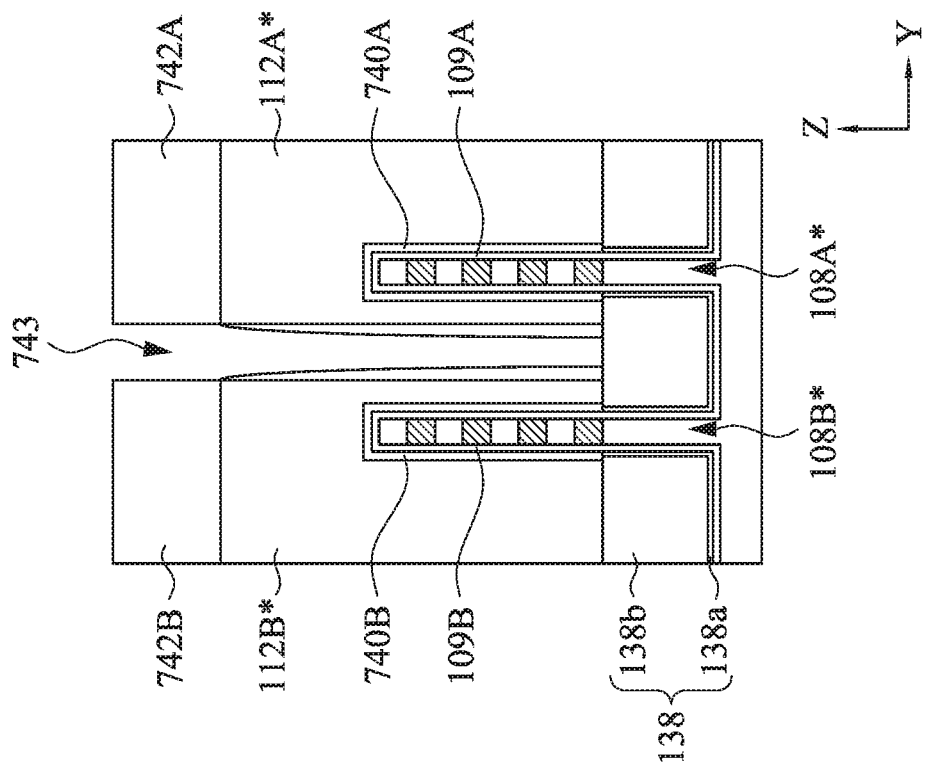
Figure 8A:
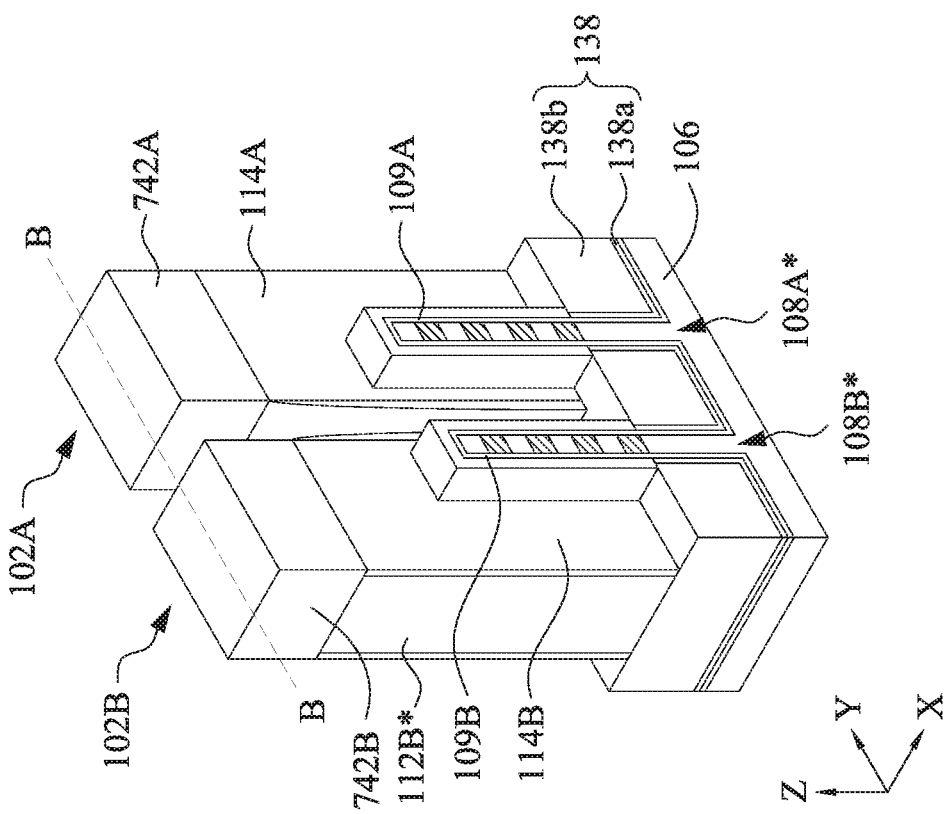

The process for forming protective oxide layers 740A-740B can include blanket depositing a layer of oxide material (not shown) on the structure of FIG. 6A followed by a high temperature annealing process and an etching process. The layer of oxide material can include silicon oxide and can be blanket deposited using a suitable deposition process, such as CVD, ALD, plasma enhanced ALD (PEALD), physical vapor deposition (PVD), or e-beam evaporation. In some embodiments, the layer of oxide material can be blanket deposited using PEALD at an energy ranging from about 400 W to about 500 W and at a temperature ranging from about 300° C. to about 500° C. The blanket deposition of the layer of oxide material can be followed by a dry annealing process under oxygen gas flow at a temperature ranging from about 800° C. to about 1050° C. The oxygen precursor concentration can be in a range of about 0.5% to about 5% of the total gas flow rate. In some embodiments, the annealing process can be a flash process where the annealing time can be between about 0.5 s to about 5 s. The etching process to form protective oxide layers 740A-740B may not follow the annealing process and can be carried out during the formation of polysilicon structures 112A*-112B* described below or as a separate etching process after the formation of polysilicon structures 112A*-112B*.

The annealing of the blanket deposited layer of oxide material for protective oxide layers 740A-740B can be followed by the formation of polysilicon structures 112A*-112B* as shown in FIGS. 7A-7B. During subsequent processing, polysilicon structures 112A*-112B* can be replaced in a gate replacement process to form gate structures 112A-112B, respectively. In some embodiments, the process for forming polysilicon structures 112A*-112B* can include blanket depositing a layer of polysilicon material on the annealed layer of oxide material for protective oxide layers 740A-740B and etching the blanket deposited layer of polysilicon material through patterned hard mask layers 742A-742B formed on the layer of polysilicon material. In some embodiments, the polysilicon material can be undoped and hard mask layers 742A-742B can include an oxide layer and/or a nitride layer. The oxide layer can be formed using a thermal oxidation process and the nitride layer can be formed by LPCVD or PECVD. Hard mask layers 742A-742B can protect polysilicon structures 112A*-112B* from subsequent processing steps (e.g., during formation of inner spacers 113A-113, outer spacers 114A-114B, epitaxial fin regions 110A-110B, ILD layer 118, and/or ESL 116).

The blanket deposition of the layer of polysilicon material can include CVD, PVD, ALD, or other suitable deposition processes. In some embodiments, the etching of the blanket deposited layer of polysilicon material can include a dry etching process, a wet etching process, or a combination thereof. In some embodiments, the etching of the blanket deposited layer of polysilicon material can include four etching steps. The first polysilicon etch step can include using a gas mixture having hydrogen bromide (HBr), oxygen ($O_2$), fluoroform ($CHF_3$), and chlorine ($Cl_2$). The second polysilicon etch step can include using a gas mixture having HBr, $O_2$, $Cl_2$, and nitrogen ($N_2$) at a pressure of about 45 mTorr to about 60 mTorr. The third polysilicon etch step can include using a gas mixture having HBr, $O_2$, $Cl_2$, $N_2$, and argon (Ar) at a pressure of about 45 mTorr to about 60 mTorr. The fourth polysilicon etch step can include using a gas mixture having HBr, $O_2$, $Cl_2$, and $N_2$ at a pressure of about 45 mTorr to about 60 mTorr. Along with the polysilicon material, the fourth polysilicon etch step can remove portions of the annealed blanket deposited layer of oxide material for protective oxide layers 740A-740B that are not covered by polysilicon structures 112A*-112B*, according to some embodiments. The first polysilicon etch step can have a higher polysilicon etch rate than the second, third, and/or fourth polysilicon etch steps. The first polysilicon etch step can be used to etch unwanted portions of the blanket deposited layer of polysilicon material above fin structures 108A*-108B*. The second, third, and fourth polysilicon etch steps can be used to etch unwanted portions of the blanket deposited layer of polysilicon material within high aspect ratio spaces 743.

In some embodiments, vertical dimensions of polysilicon structures 112A*-112B* along a Z-axis on top surfaces of fin structures 108A*-108B* can be in a range from about 40 nm to about 60 nm. Polysilicon structures 112A*-112B* can have an aspect ratio equal to or greater than about 9, where aspect ratio is a ratio of a vertical dimension along a Z-axis to a horizontal dimension along a Y-axis of polysilicon structures 112A*-112B*. In some embodiments, horizontal dimensions between center lines of adjacent polysilicon structures 112A*-112B* along a Y-axis (e.g., spacing) can be in a range from about 30 nm to about 70 nm.

Following the formation of polysilicon structures 112A*-112B*, the portions of the blanket deposited layer of oxide that are not covered by polysilicon structures 112A*-112B* can be removed by a dry or a wet etch process if they are not removed during the fourth polysilicon etch step to form the structure of FIGS. 7A-7B. The structure of FIGS. 7A-7B has polysilicon structures 112A*-112B* and protective oxide layers 740A-740B disposed on stacks of nanostructured regions 120B and 122B (FIG. 7B), respectively, and has stacks of nanostructured regions 120A and 122A (FIG. 7A)

extending out from either sides of polysilicon structures 112A*-112B*, respectively, along an X-axis.

In some embodiments, protective oxide layers 740A-740B can have vertical dimensions (e.g., thickness on top surface of fin structures 108A*-108B*) along a Z-axis and horizontal dimensions (e.g., thickness on sidewalls of fin structures 108A*-108B*) along a Y-axis ranging from about 1 nm to about 3 nm. In some embodiments, the vertical dimensions can be equal to or greater than the horizontal dimensions. The presence of protective oxide layers 740A-740B allow etching polysilicon material from high aspect ratio spaces 743 (e.g., aspect ratio greater than 1:15, 1:18, or 1:20) without substantially etching and/or damaging fin structures 108A*-108B* during the formation of polysilicon structures 112A*-112B*.

Referring to FIG. 3, in operation 325, outer spacers are formed on sidewalls of the polysilicon structures and on the passivation layers. For example, outer spacers 114A-114B can be formed on sidewalls of polysilicon structures 112A*-112B* and on portions of passivation layers 109A-109B not covered by polysilicon structures 112A*-112B*, as described with reference to FIGS. 8A-8B. The process for forming outer spacers 114A-114B can include blanket depositing a layer of an insulating material (e.g., an oxide or a nitride material) on the structure of FIG. 7A by a CVD, a PVD, or an ALD process followed by photolithography and an etching process (e.g., reactive ion etching or other dry etching process using a chlorine or fluorine based etchant).

Figure 9B:
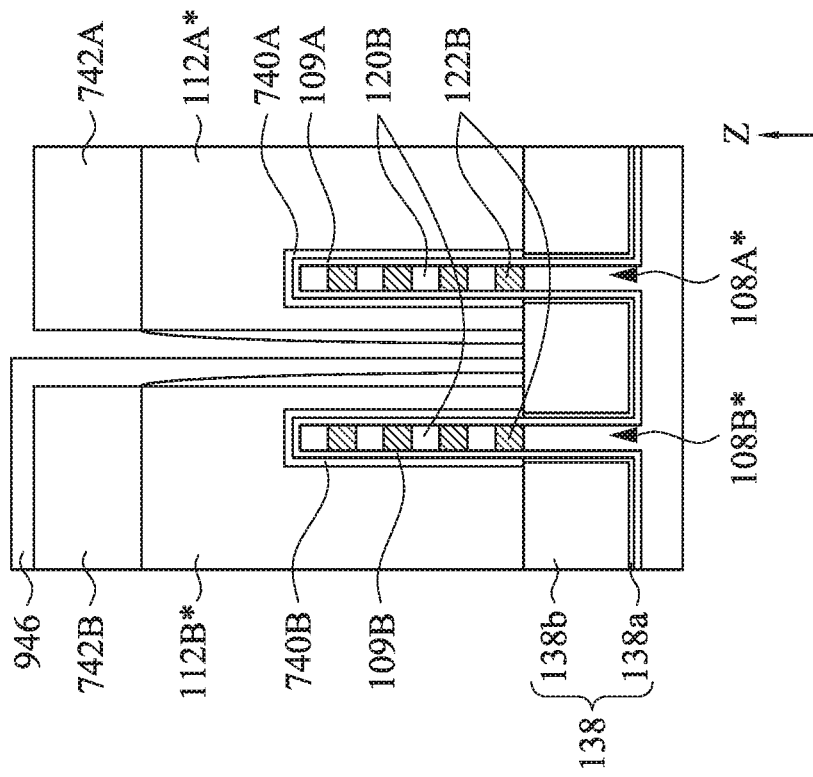
Figure 9A:
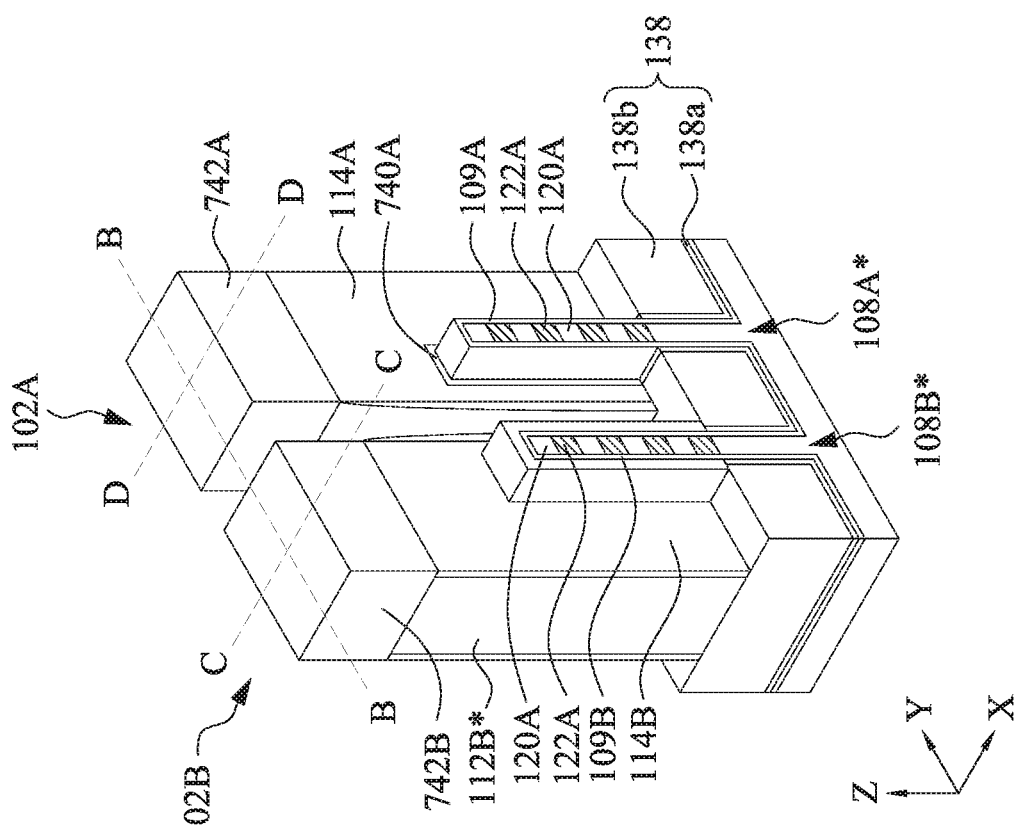

Referring to FIG. 3, in operation 330, inner spacers and epitaxial fin regions are formed on the fin structures. For example, inner spacers 113A-113B and epitaxial fin regions 110A-110B can be formed on portions of fin structures 108A*-108B* (e.g., nanostructured regions 120A and 122B, respectively) not underlying polysilicon structures 112A*-112B*, respectively, as described with reference to FIGS. 9A-13D. The processing steps illustrated with FIGS. 9A-13D describe the sequential formation of inner spacers 113A-113B and the sequential formation of epitaxial regions 110A-110B for FETs 102A-102B with different conductivity from each other. For example, FET 102A can be n-type and FET 102B can be p-type. Prior to the formation of inner spacers 113A and epitaxial regions 110A of FET 102A, FET 102A can be protected by patterning a photoresist layer 946 on FET 102B as shown in FIGS. 9B-9C. Photoresist layer 946 is not shown in FIGS. 9A-12A for the sake of clarity.

The process for forming inner spacers 113A of FET 102A can include etching portions of outer spacers 114A from the stack of nanostructured regions 120A and 122A extending out from either sides of polysilicon structure 112A* along an X-axis. The etching process can include a dry etch process with etchant gases, such as $CH_4$, $O_2$, and $CH_3F$. The flow rate ratio of $CH_4$:$O_2$:$CH_3F$ can range from about 1:1:1 to about 1:2:4. The etching process can be performed at a high bias voltage ranging from about 300 V to about 450 V.

The process for forming inner spacers 113A can further include etching nanostructured regions 122A from the stack of nanostructured regions 120A and 122A after the etching of outer spacers 114A. In some embodiments, nanostructured regions 120A and 122A can include Si without any substantial amount of Ge and SiGe, respectively, (e.g., with no Ge and SiGe, respectively) and the etching of nanostructured regions 122A can include using a dry etching process that has a higher etch selectivity towards SiGe than Si. For example, halogen-based chemistries can exhibit etch selectivity that is higher for Ge than for Si. Therefore, halogen gases can etch SiGe faster than Si. In some embodiments, the halogen-based chemistries can include fluorine-based and/or chlorine-based gasses. Alternatively, the etching of nanostructured regions 122A can include using a wet etching process with higher selectivity towards SiGe than Si. For example, the wet etching process can include using a mixture of sulfuric acid ($H_2SO_4$) and hydrogen peroxide ($H_2O_2$) (SPM) and/or a mixture of ammonia hydroxide ($NH_4OH$) with $H_2O_2$ and deionized (DI) water (APM).

Figure 10B:
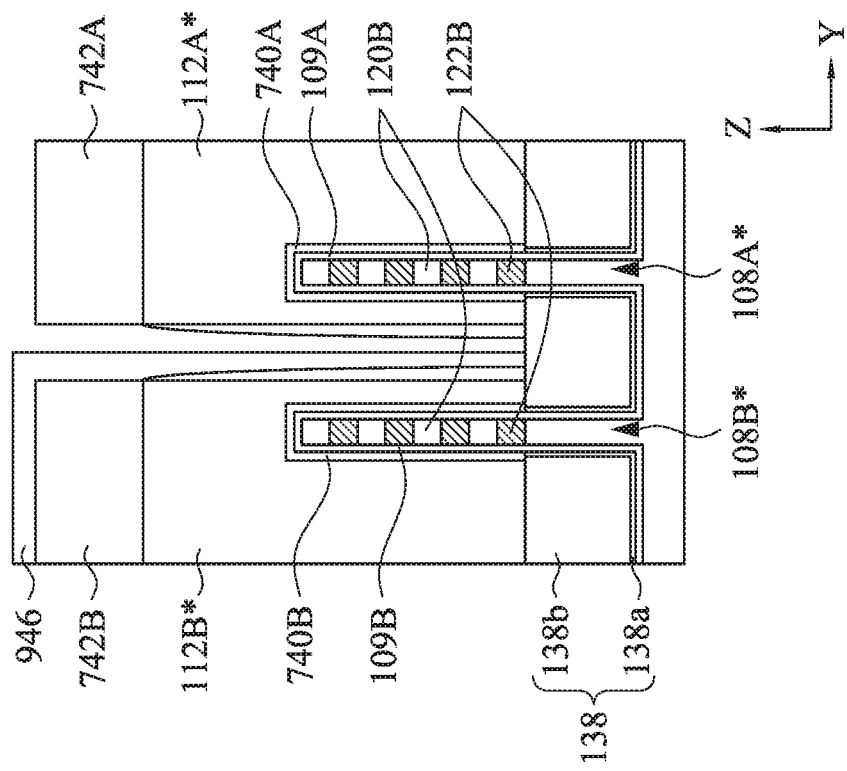
Figure 10A:
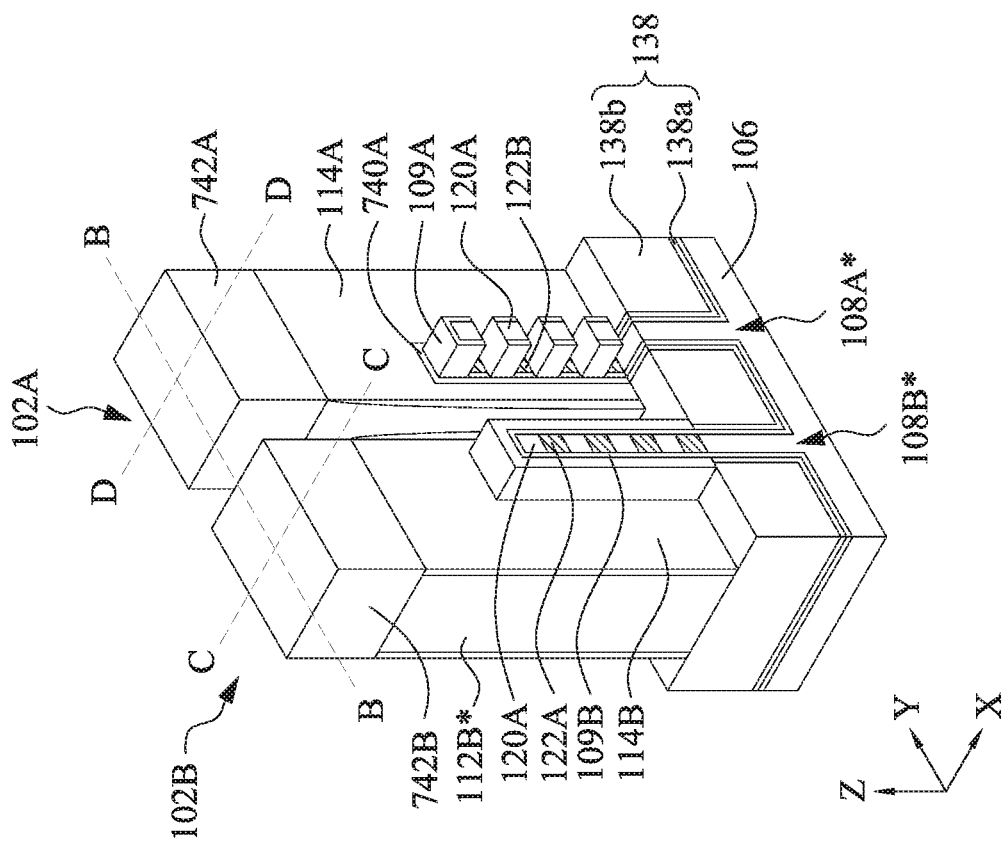

As a result of the etching of nanostructured regions 122A, suspended nanostructured regions 120A can be formed with openings 1048 between them as shown in FIGS. 10A and 10D. Also, the etching of nanostructured regions 122A can create a linear etch profile 122Bs$_1$ or a curved etch profile 122Bs$_2$ (shown with curved dashed line) of the sidewalls of nanostructured regions 122B underlying polysilicon structure 112A* as shown in FIG. 10D. The etching process can be controlled such that openings 1048 extend along an X-axis at least under outer spacers 114A and the sidewalls of nanostructured regions 122B are substantially aligned with interfaces 114As between outer spacers 114A and polysilicon structure 112A* as shown in FIG. 10D. In some embodiments, openings 1048 can further extend along an X-axis under polysilicon structure 112A* such that the sidewalls of nanostructured regions 122B are disposed about 1 nm to about 10 nm away from interface 114As. Extending openings 1048 below outer spacers 114A or polysilicon structure 112A* can prevent portions of nanostructured regions 122B remaining under outer spacers 114A or prevent formation of gate structure 112A under outer spacers 114A during the replacement of nanostructured regions 122B and polysilicon structure 112A* with gate structure 112A in subsequent processing (e.g., in operation 340).

The process for forming inner spacers 113A can further include blanket depositing a layer of low-k dielectric material (not shown) on the structure of FIG. 10A until openings 1048 are filled or partially filled with the layer of low-k dielectric material. The blanket deposition process can include using an ALD process or a CVD process. In some embodiments, the blanket deposition process can include a plurality of cycles of deposition and etch processes. In each cycle, the etch process can follow the deposition process to prevent the formation of voids within the layer of low-k dielectric material deposited in openings 1048 by removing seams that can be formed during the filling of the layer of low-k dielectric material within openings 1048. The etch process in each cycle of the blanket deposition process can include a dry etch process using a gas mixture of HF and $NF_3$. The gas ratio of HF to $NF_3$ can range from about 1 to about 20. In some embodiments, the low-k dielectric material can include silicon, oxygen, carbon, and/or nitrogen. The low-k dielectric material can include silicon oxycarbonitride (SiOCN), silicon carbon nitride (SiCN), silicon oxide carbide (SiOC), polymides, carbon-doped oxides, fluorine-doped oxides, hydrogen-doped oxides, or a combination thereof.

Figure 11B:
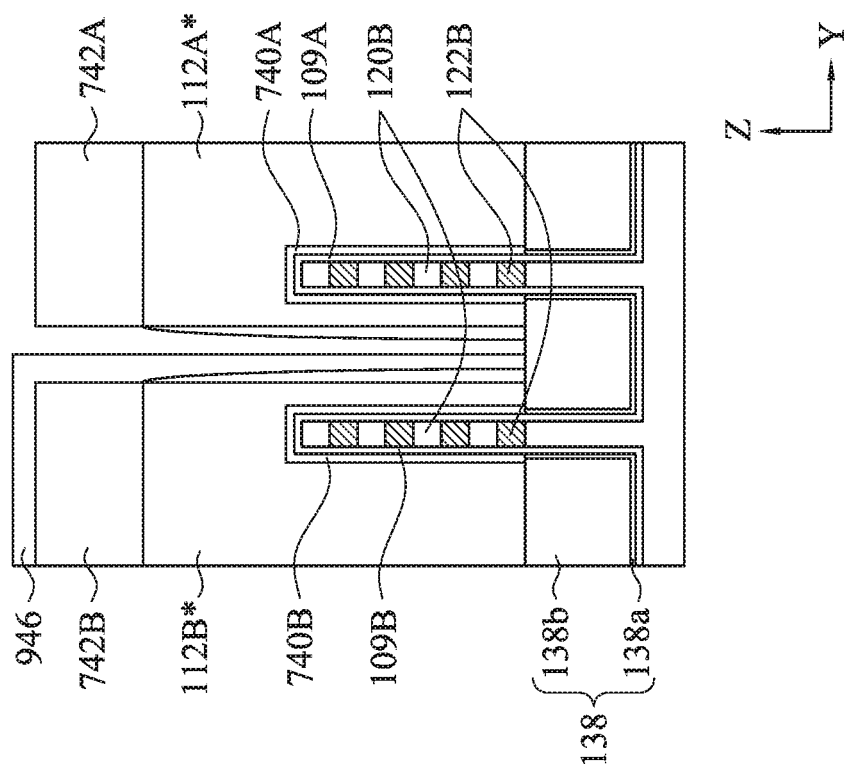
Figure 11A:
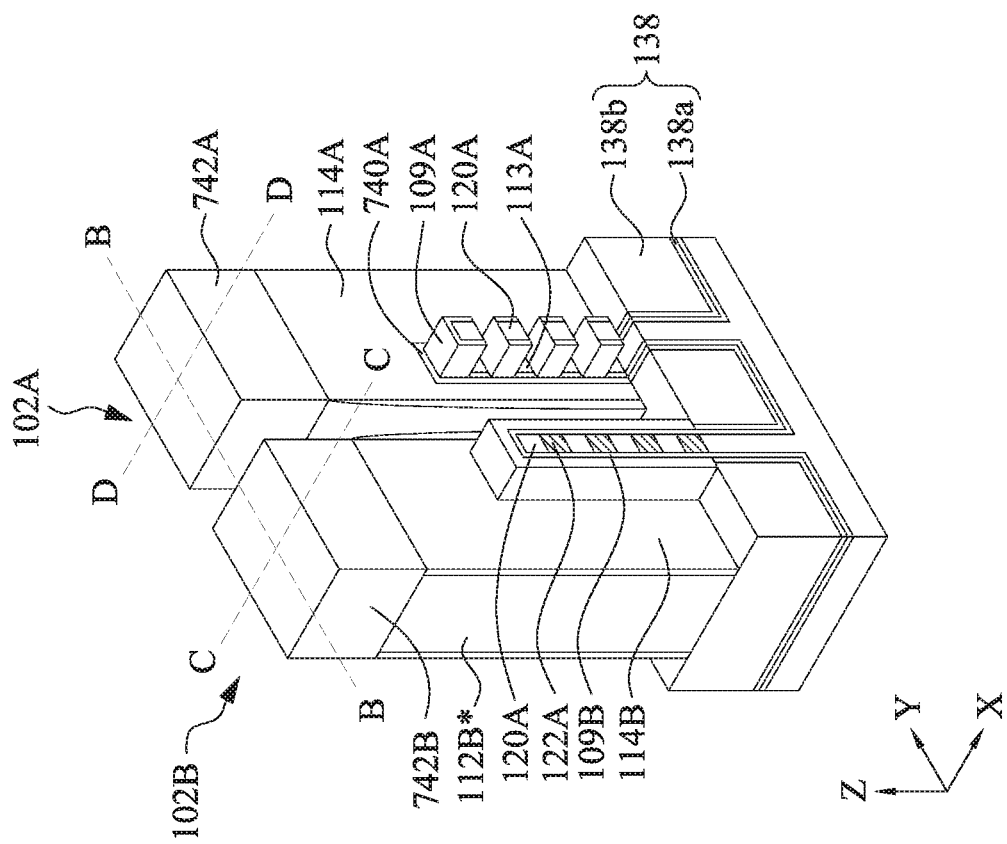

The process for forming inner spacers 113A can further include etching the blanket deposited layer of low-k dielectric material to etch back the layer of low-k dielectric material within openings 1048 to form inner spacers 113A and remove other portions of the layer of low-k material from surfaces of FET 102A as shown in FIGS. 11A and 11D. The etching of the blanket deposited layer of low-k dielectric material can include a dry etch process using a gas mixture of HF and $NF_3$. The gas ratio of HF to $NF_3$ can range from about 1 to about 20. In some embodiments, the etching can be performed in two etch steps. In the first etch step, the gas ratio of HF to $NF_3$ can range from about 1 to about 10. The first etch step can remove portions of the layer of low-k material from surfaces of FET 102A and partially etch back the layer of low-k material within opening 1048. In the second etch step, the gas ratio of HF to $NF_3$ can be higher than the first etch step and can range from about 5 to about 20. The second etch step can achieve the structure of inner spacers 113A as shown in FIG. 11D. In some embodiments, interfaces 113As between inner spacers 113A and nanostructured regions 122B follow the etch profile of the sidewalls of nanostructured regions 122B. For example, interfaces 113As can have a linear profile as shown in FIG. 11D when the sidewalls of nanostructured regions 122B have linear etch profile $122Bs_1$ (FIG. 10D) or interface 113As can have a curved profile (not shown) when the sidewalls of nanostructured regions 122B have curved etch profile $122Bs_2$ (FIGS. 10D and 11D).

Referring to FIGS. 12A-12D, epitaxial fin regions 110A can be grown around the suspended nanostructured regions 120A after the formation of inner spacers 113A. In some embodiments, epitaxial fin regions 110A can be grown by (i) CVD, such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110A can be grown by an epitaxial deposition/partial etch process, which repeats the epitaxial deposition/partial etch process at least once. In some embodiments, epitaxial fin regions 110A can be p-type when nanostructured regions 120A include SiGe or n-type when nanostructured regions 120A include Si without any substantial amount of Ge (e.g., with no Ge). P-type epitaxial fin regions 110A can include SiGe and can be in-situ doped during the epitaxial growth process using p-type dopants, such as boron, indium, or gallium. For p-type in-situ doping, p-type doping precursors such as, but not limited to, diborane (B2H6), boron trifluoride (BF3), and/or other p-type doping precursors can be used. N-type epitaxial fin regions 110A can include Si without any substantial amount of Ge (e.g., with no Ge) and can be in-situ doped during the epitaxial growth process using n-type dopants, such as phosphorus or arsenic. For n-type in-situ doping, n-type doping precursors such as, but not limited to, phosphine (PH3), arsine (AsH3), and/or other n-type doping precursor, can be used.

Figure 12B:
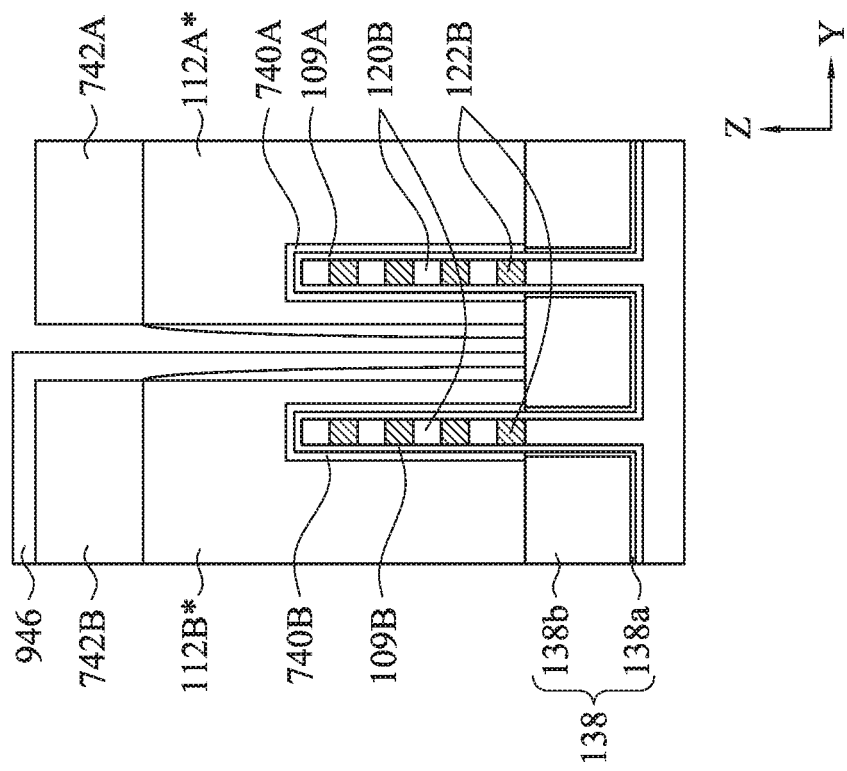
Figure 12A:
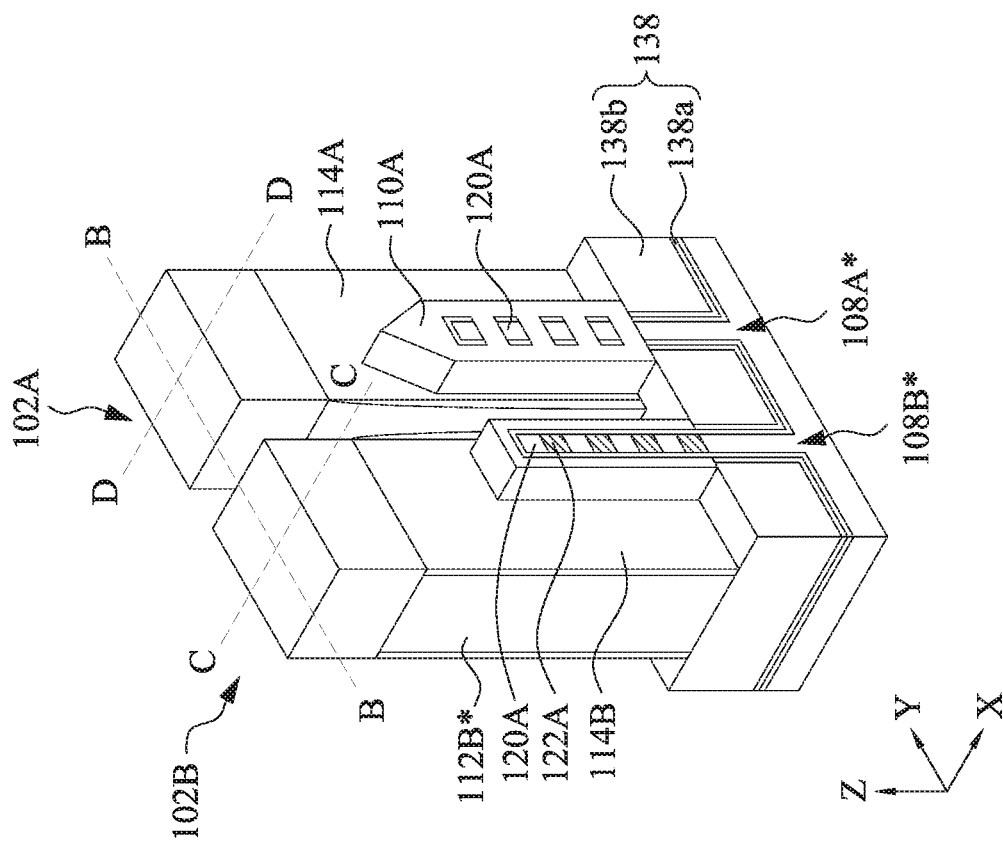

In some embodiments, instead of forming epitaxial fin regions 110A around the suspended nanostructured regions 120A as shown in FIGS. 12A and 12D, epitaxial fin regions 110A can be grown on fin base portion 119 as shown in FIGS. 1E and 1G. Epitaxial fin regions 110A such as shown in FIG. 1G can be grown on fin base portion 119 after removing the suspended nanostructured regions 120A following the formation of inner spacers 113A. The process for removing the suspended nanostructured regions 120A can include a dry etch process with etchant gases, such as $CH_4$, O2, and $CH_3F$. The flow rate ratio of $CH_4:O_2:CH_3F$ can range from about 1:1:1 to about 1:2:4. The etching process can be performed at a high bias voltage ranging from about 300 V to about 450 V. The etching of the suspended nanostructured regions 120A can include using a wet etching process with higher selectivity towards Si than SiGe. For example, the wet etching process can include using a mixture ($NH_4OH$) with HCl.

After the formation of inner spacers 113A and epitaxial regions 110A of FET 102A, photoresist layer 946 can be removed from FET 102B and another photoresist layer 1346 can be patterned on FET 102A (shown in FIGS. 13B and 13D) to protect FET 102A during the subsequent processing steps to form inner spacers 113B and epitaxial regions 110B of FET 102B as described with reference to FIGS. 13A-15D. Photoresist layer 1346 is not shown in FIGS. 13A-15A for the sake of clarity.

Referring to FIGS. 13A-13D, the process for forming inner spacers 113B can include etching portions of outer spacers 114B from the stack of nanostructured regions 120A and 122A extending out from either sides of polysilicon structure 112B* along an X-axis, followed by etching nanostructured regions 120A from the stack of nanostructured regions 120A and 122A. The process for etching the portions of outer spacers 114B can include a dry etch process with etchant gases, such as $CH_4$, O2, and $CH_3F$. The flow rate ratio of $CH_4:O_2:CH_3F$ can range from about 1:1:1 to about 1:2:4. The etching process can be performed at a high bias voltage ranging from about 300 V to about 450 V. The etching of nanostructured regions 120A can include using a wet etching process with higher selectivity towards Si than SiGe. For example, the wet etching process can include using a mixture ($NH_4OH$) with HCl.

Figure 13B:
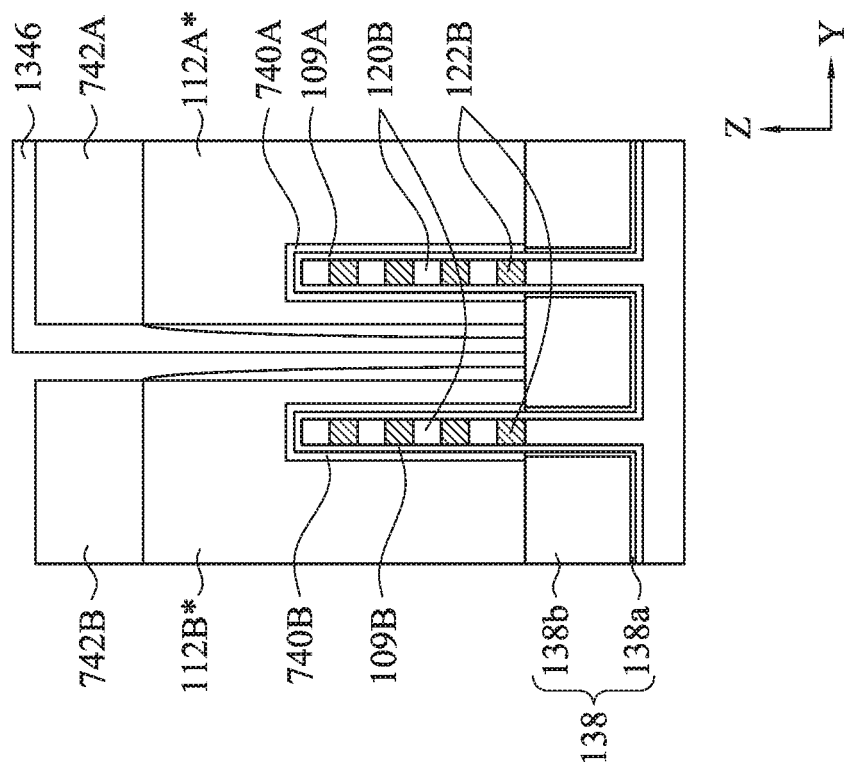
Figure 13A:
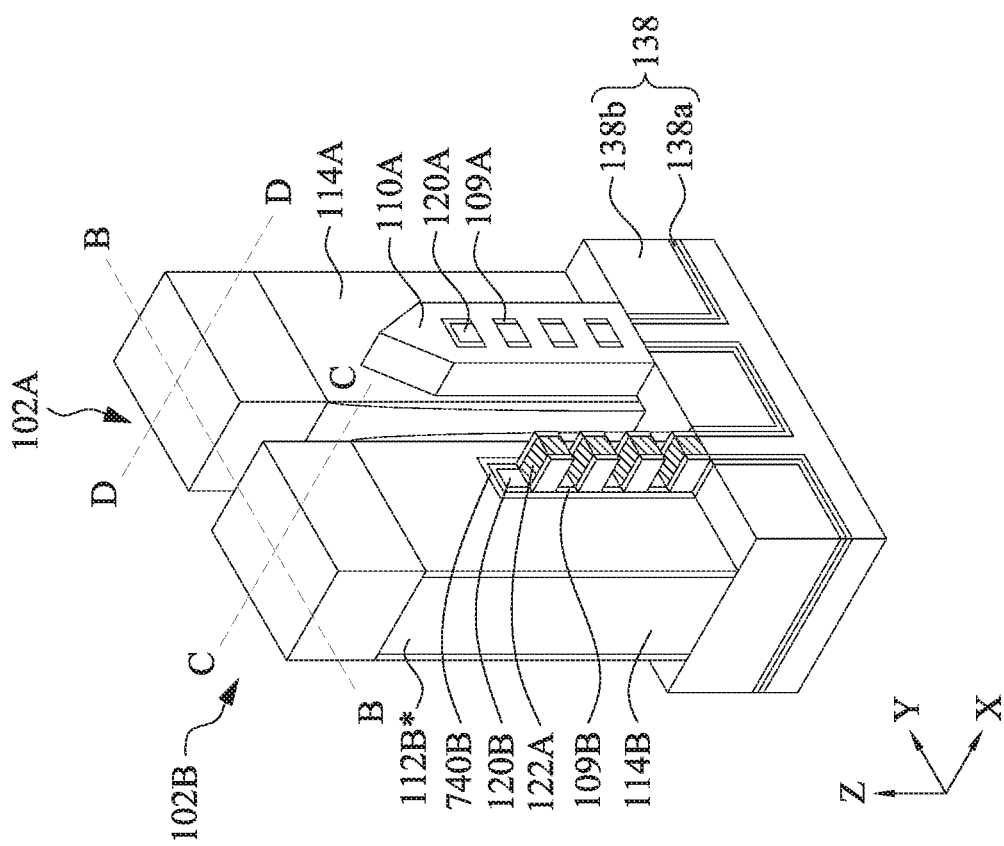
Figure 13D:
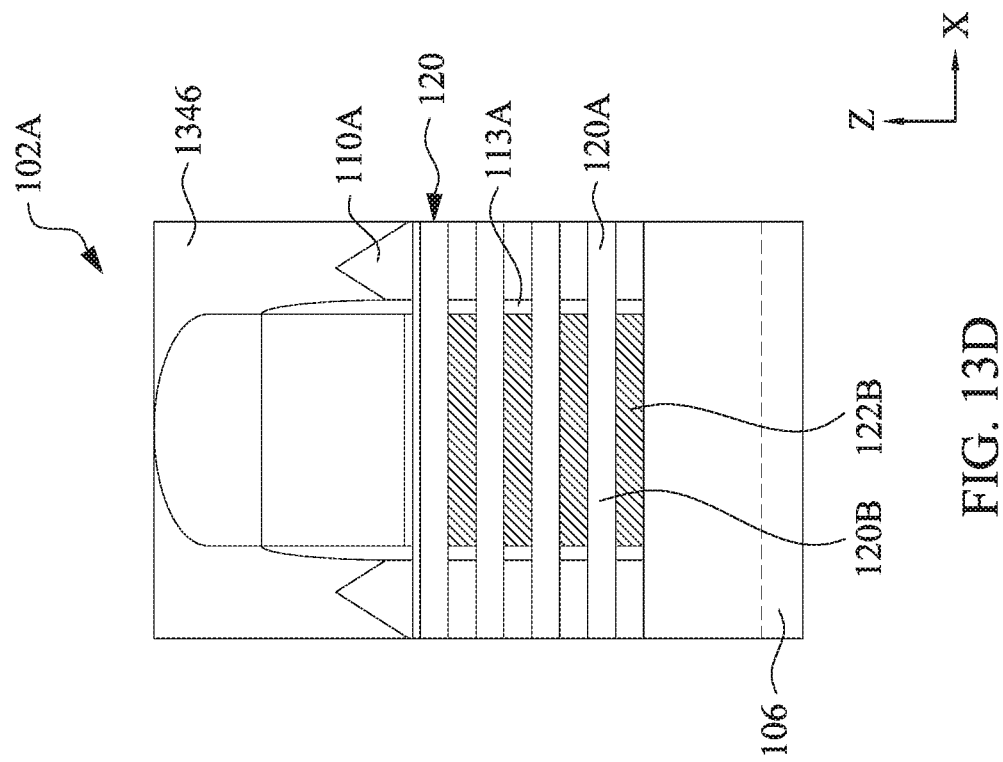
Figure 13C:
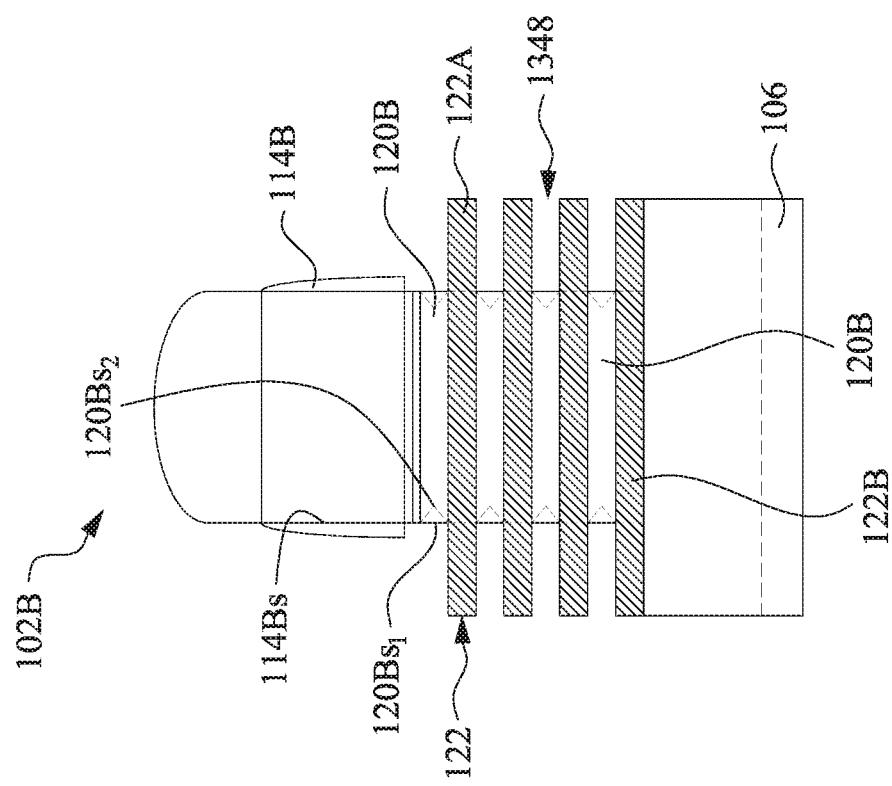

As a result of the etching of nanostructured regions 120A, suspended nanostructured regions 122A can be formed with openings 1348 between them as shown in FIGS. 13A and 13C. Also, the etching of nanostructured regions 120A can create a linear etch profile $120Bs_1$ or a substantially triangular etch profile $120Bs_2$ (shown with dashed line) of the sidewalls of nanostructured regions 120B underlying polysilicon structure 112B* as shown in FIG. 13C. The etch profiles $120Bs_2$ (FIG. 13C) and $122Bs_2$ (FIG. 10D) can be different due to the different crystal structure and/or crystal orientation of the different materials of nanostructured regions 120B and 122B, respectively. For example, nanostructured regions 120B with Si material can have etch profile $120Bs_2$ and nanostructured regions 122B with SiGe can have etch profile $122Bs_2$.

The process for etching nanostructured regions 120A can be controlled such that openings 1348 extend along an X-axis at least under outer spacers 114B and the sidewalls of nanostructured regions 120B are substantially aligned with interface 114Bs between outer spacers 114B and polysilicon structure 112B* as shown in FIG. 13C. In some embodiments, openings 1348 can further extend along an X-axis under polysilicon structure 112B* such that the sidewalls of nanostructured regions 120B are disposed about 1 nm to about 10 nm away from interfaces 114Bs. Extending openings 1348 below outer spacers 114B or polysilicon structure 112B* can prevent portions of nanostructured regions 120B remaining under outer spacers 114B or prevent formation of gate structure 112B under outer spacers 114B during the replacement of nanostructured regions 120B and polysilicon structure 112B* with gate structure 112B in subsequent processing (e.g., in operation 340).

The process for forming inner spacers 113B can further include blanket depositing a layer of low-k dielectric material (not shown) on the structure of FIG. 13A until openings 1348 are filled or partially filled with the layer of low-k dielectric material. The blanket deposition process can be similar to that used to deposit the layer of low-k dielectric material within openings 1048 for forming inner spacer 113A.

Figure 14B:
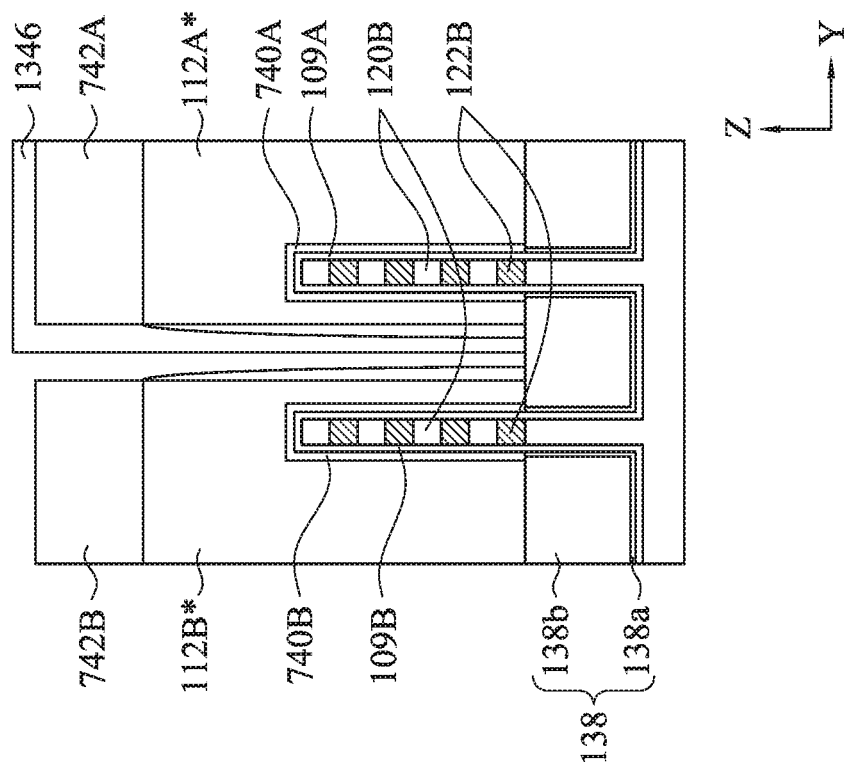
Figure 14A:
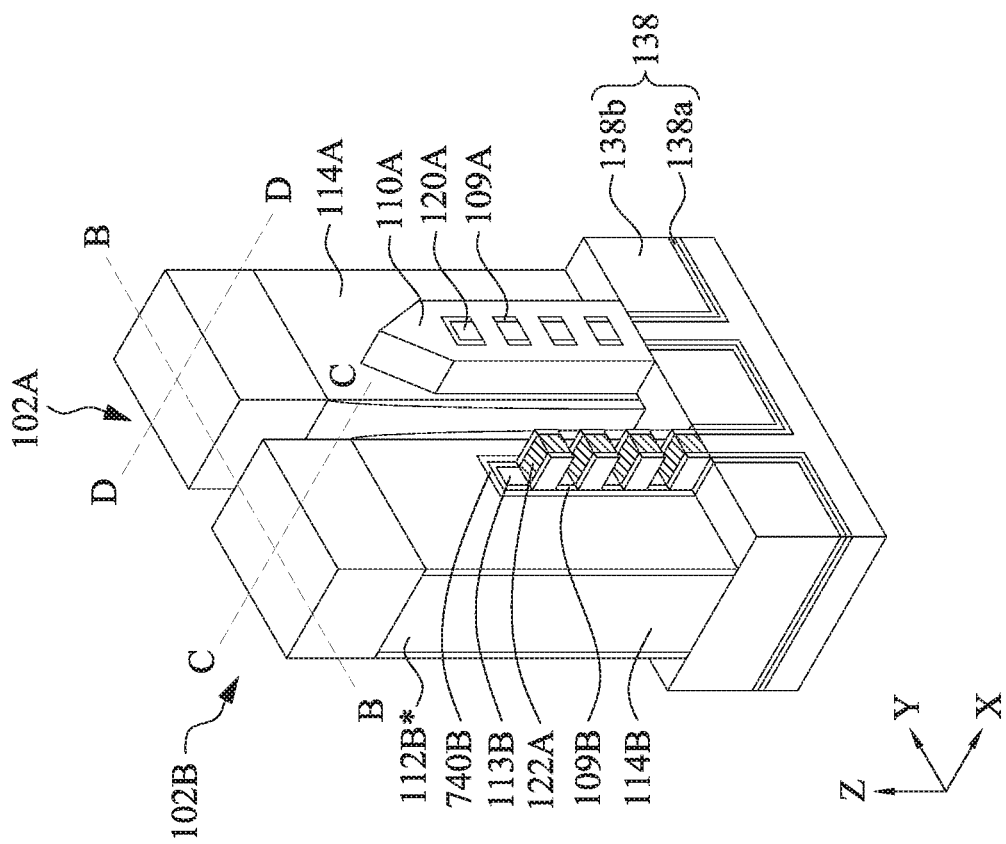
Figure 14D:
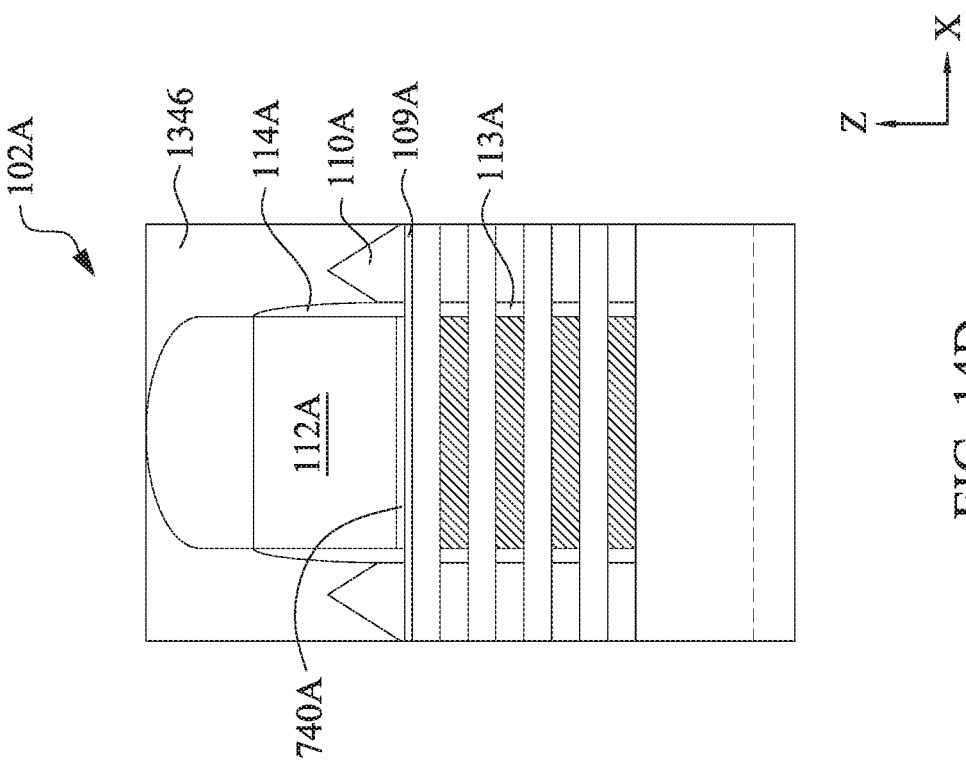
Figure 14C:
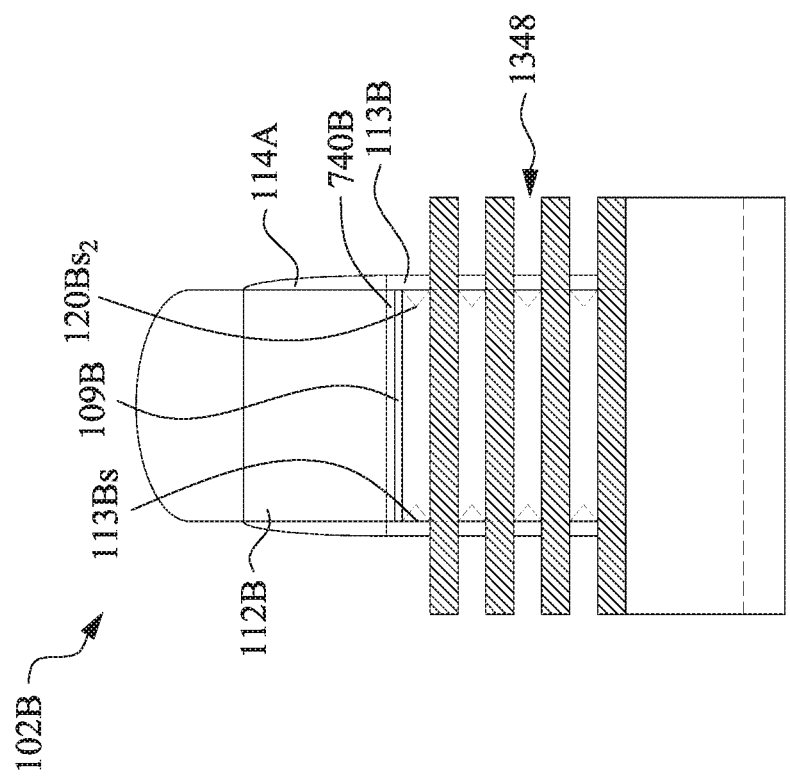

The process for forming inner spacers 113B can further include etching the blanket deposited layer of low-k dielectric material to etch back the layer of low-k dielectric material within openings 1348 to form inner spacers 113B and remove other portions of the layer of low-k material from surfaces of FET 102B as shown in FIGS. 14A and 14C. The etching of the blanket deposited layer of low-k dielectric material can include a dry etch process using a gas mixture of HF and NF$_3$. The gas ratio of HF to NF$_3$ can range from about 1 to about 20. In some embodiments, the etching can be performed in two etch steps. In the first etch step, the gas ratio of HF to NF$_3$ can range from about 1 to about 10. The first etch step can remove portions of the layer of low-k material from surfaces of FET 102B and partially etch back the layer of low-k material within opening 1348. In the second etch step, the gas ratio of HF to NF$_3$ can be higher than the first etch step and can range from about 5 to about 20. The second etch step can achieve the structure of inner spacers 113B as shown in FIG. 14C. In some embodiments, interfaces 113Bs between inner spacers 113B and nanostructured regions 120B follow the etch profile of the sidewalls of nanostructured regions 120B. For example, interfaces 113Bs can have a linear profile as shown in FIG. 14C when the sidewalls of nanostructured regions 122B have linear etch profile 122As$_1$ (FIG. 10D) or interfaces 113Bs can have a triangular profile (not shown) when the sidewalls of nanostructured regions 120B have triangular etch profile 120Bs$_2$ (FIGS. 13C and 14C).

Figure 15B:
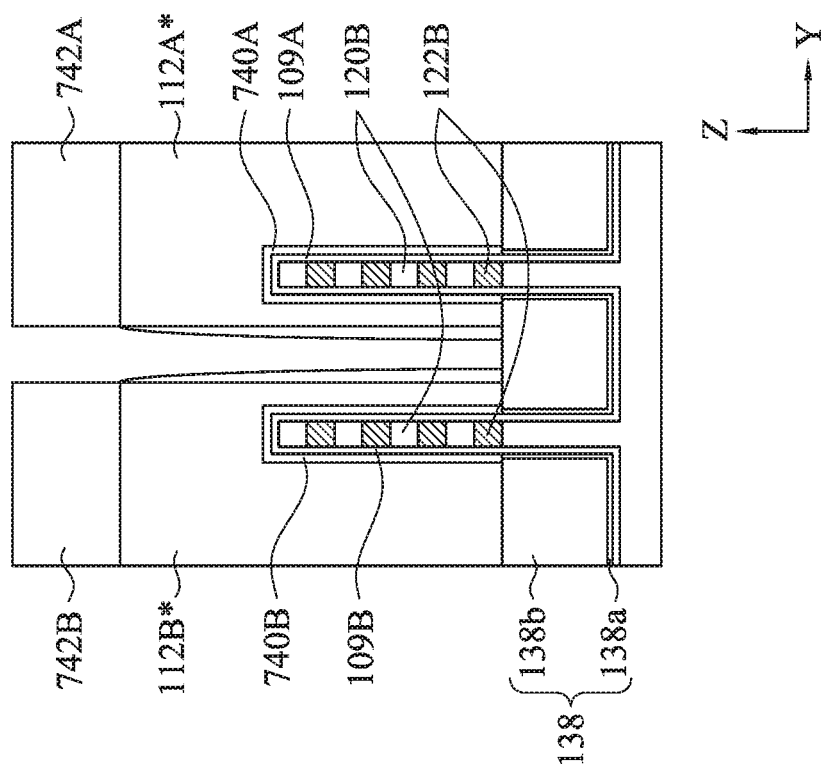
Figure 15A:
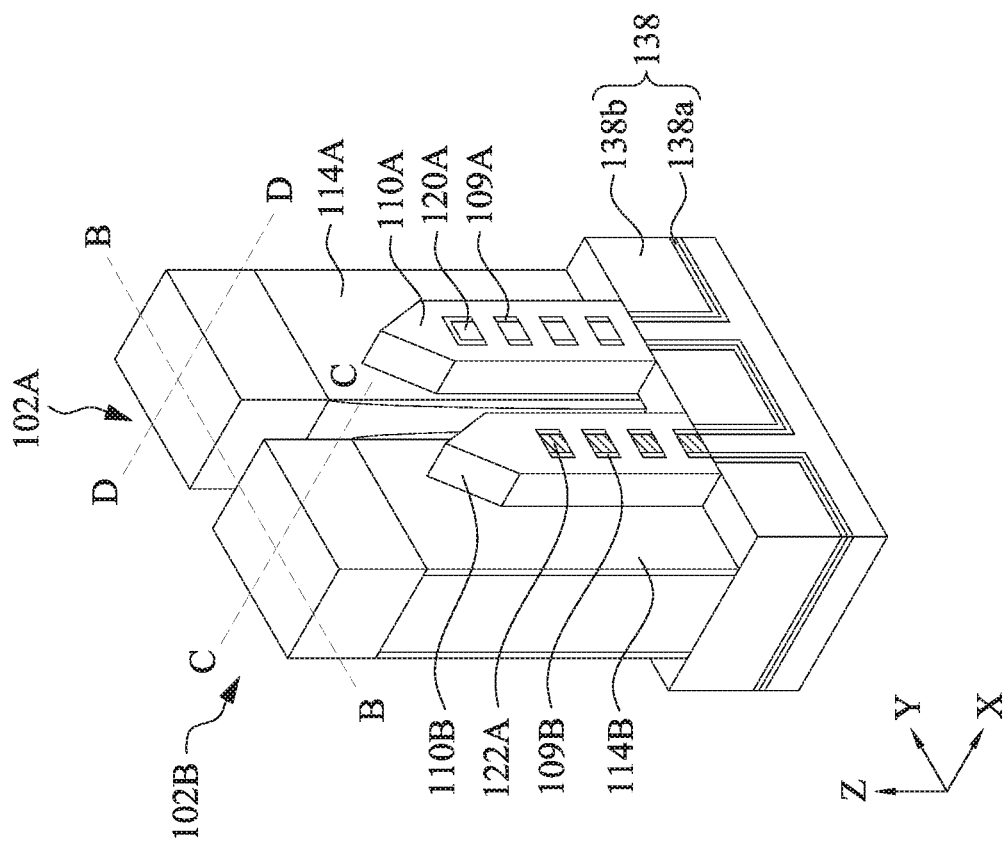
Figure 15D:
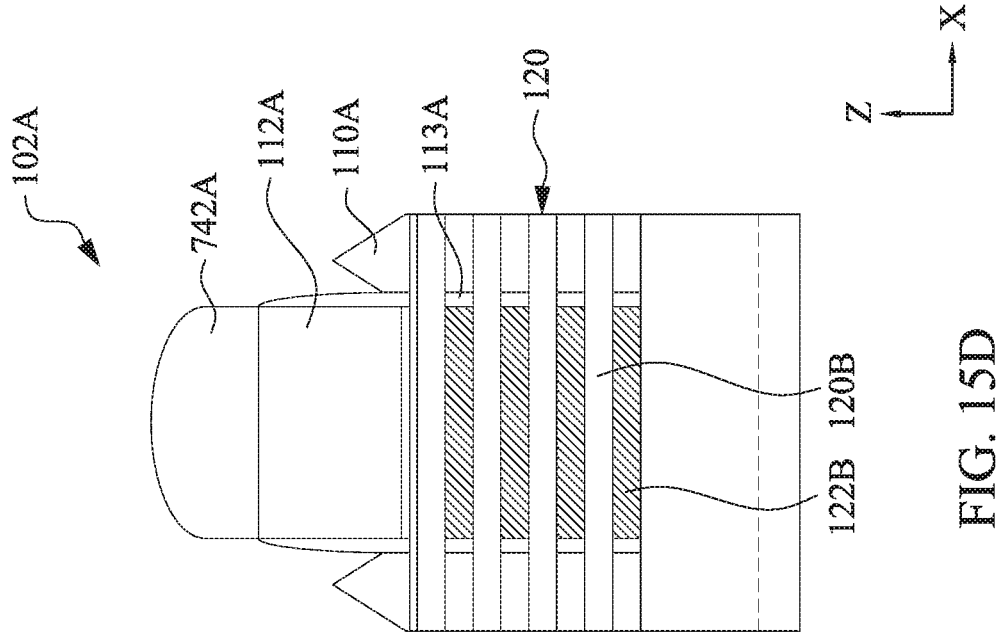
Figure 15C:
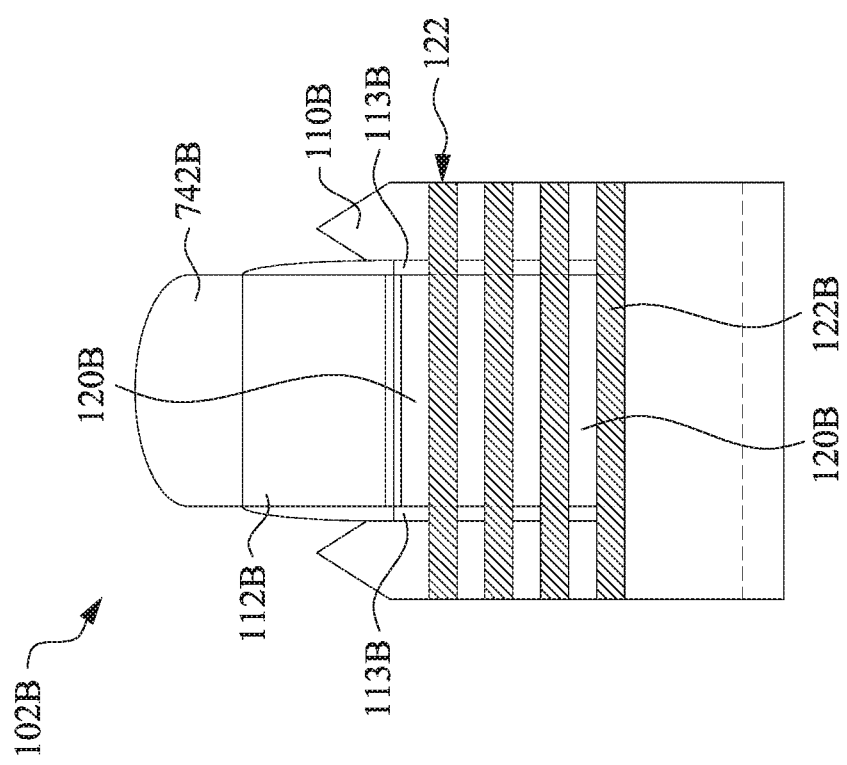

Referring to FIGS. 15A-15D, epitaxial fin regions 110B can be grown around the suspended nanostructured regions 122A after the formation of inner spacers 113B. Epitaxial fin regions 110B can be grown similarly as epitaxial fin regions 110A described with reference to FIG. 12A-12D. In some embodiments, epitaxial fin regions 110B can be p-type when nanostructured regions 122A include SiGe or n-type when nanostructured regions 122A include Si without any substantial amount of Ge (e.g., with no Ge). After the formation of inner spacers 113B and epitaxial regions 110B, photoresist layer 1346 can be removed from FET 102A as shown in FIGS. 15B and 15D.

Similar to epitaxial fin regions 110A, in some embodiments, instead of forming epitaxial fin regions 110B around the suspended nanostructured regions 122A as shown in FIGS. 15A and 15D, epitaxial fin regions 110B can be grown on fin base portion 121 as shown in FIGS. 1E and 1F. Epitaxial fin regions 110B such as shown in FIG. 1F can be grown on fin base portion 121 after removing the suspended nanostructured regions 122A following the formation of inner spacers 113B. The process for removing the suspended nanostructured regions 122A can include using a dry etching process that has a higher etch selectivity towards SiGe than Si. For example, halogen-based chemistries can exhibit etch selectivity that is higher for Ge than for Si. Therefore, halogen gases can etch SiGe faster than Si. In some embodiments, the halogen-based chemistries can include fluorine-based and/or chlorine-based gasses. Alternatively, the etching of nanostructured regions 122A can include using a wet etching process with higher selectivity towards SiGe than Si. For example, the wet etching process can include using a mixture of sulfuric acid (H$_2$SO$_4$) and hydrogen peroxide (H$_2$O$_2$) (SPM) and/or a mixture of ammonia hydroxide (NH$_4$OH) with H$_2$O$_2$ and deionized (DI) water (APM).

In some embodiments, the processing steps for forming inner spacers 113A-113B can be simultaneously performed without using photoresist layers 946 and 1346 if both FETs 102A-102B are of the same conductivity type (e.g., n-type or p-type). Similarly, the processing steps for forming epitaxial fin regions 110A-11B can be simultaneously performed without using photoresist layers 946 and 1346 after simultaneously forming inner spacers 113A-113B if both FETs 102A-102B are of similar conductivity type.

Referring to FIG. 3, in operation 335, nanostructured channel regions are formed between the epitaxial fin regions. For example, nanostructured channel regions 120B and 122B can be formed sequentially in regions of fin structures 108A*-108B* underlying polysilicon structures 112A*-112B*, as described with reference to FIGS. 16A-19D. Prior to the formation of nanostructured channel regions 120B and 122B, ESL 116 can be deposited on the structure of FIG. 15A and ILD 118 can be deposited on ESL 116.

In some embodiments, ESL 116 can be formed of materials including SiN$_x$, SiO$_x$, SiON, SiC, SiCN, BN, SiBN, SiCBN, or a combination thereof. The formation of ESL 116 can include blanket depositing a layer of material for ESL 116 on the structure of FIG. 15A using PECVD, sub atmospheric chemical vapor deposition (SACVD), LPCVD, ALD, high-density plasma (HDP), plasma enhanced atomic layer deposition (PEALD), molecular layer deposition (MLD), plasma impulse chemical vapor deposition (PICVD), or other suitable deposition methods.

Figure 16B:
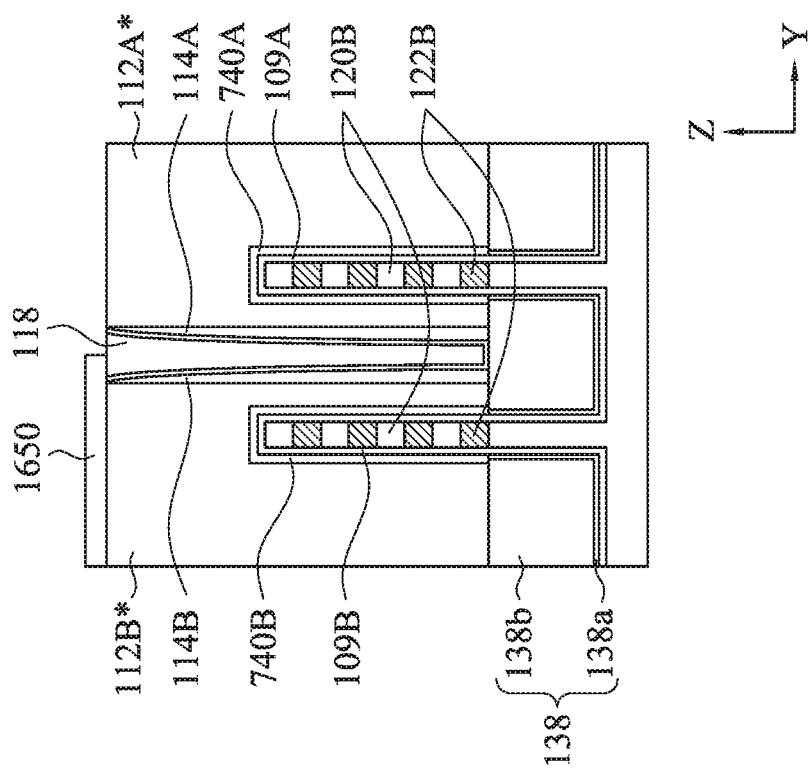
Figure 16A:
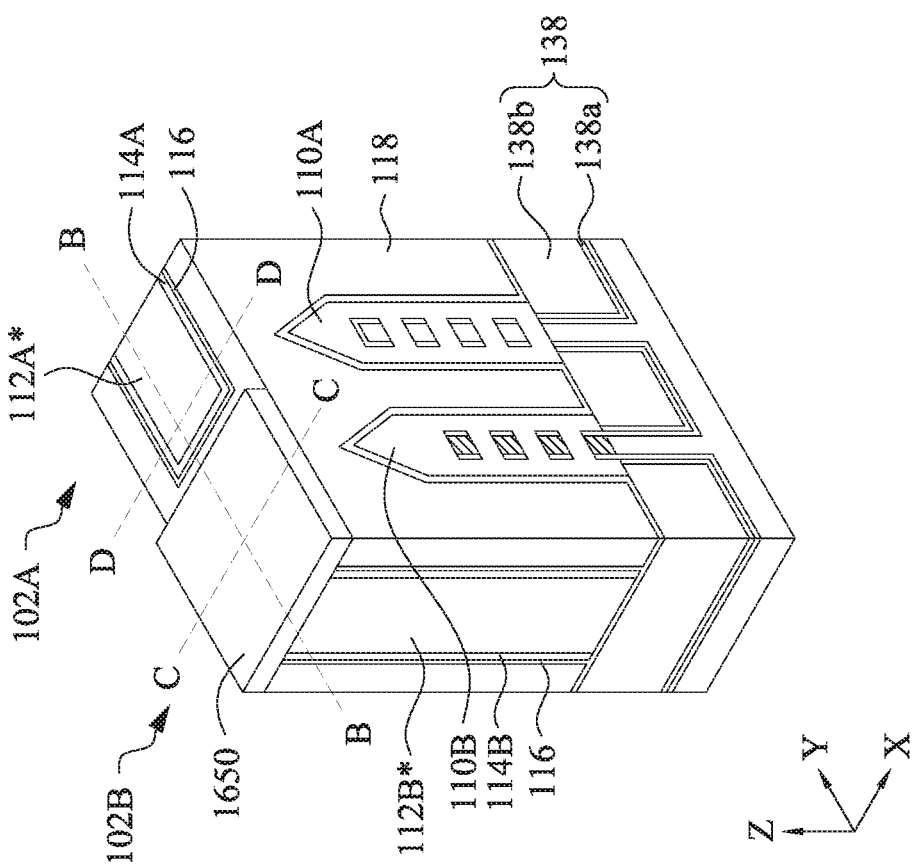
Figure 16D:
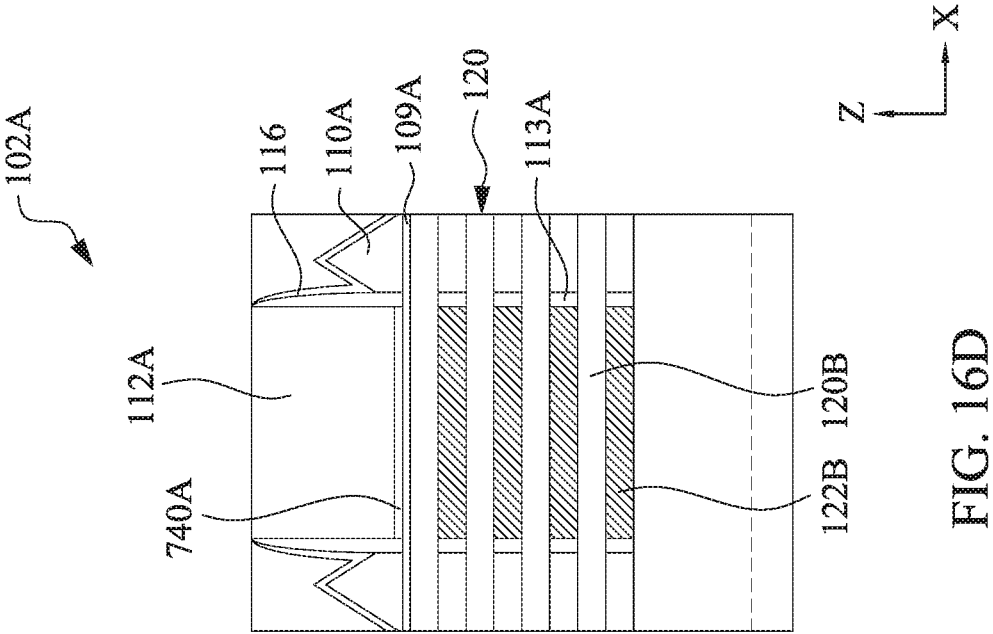

The blanket deposition of the layer of material for ESL 116 can be followed by a blanket deposition of a layer of dielectric material for ILD 118. In some embodiments, the dielectric material can be silicon oxide. The layer of dielectric material can be deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using a FCVD process. The blanket deposition process can be followed by a thermal annealing of the deposited layer of dielectric material in steam at a temperature ranging from about 200° C. to about 700° C. for a period ranging from about 30 minutes to about 120 minutes. The thermal annealing can be followed by a CMP process to coplanarize top surfaces of ESL 116, ILD 118, outer spacers 114A-114B, and polysilicon structures 112A*-112B* with each other as shown in FIG. 16A. During the CMP process, hard mask layers 742A-742B can be removed.

Figure 16C:
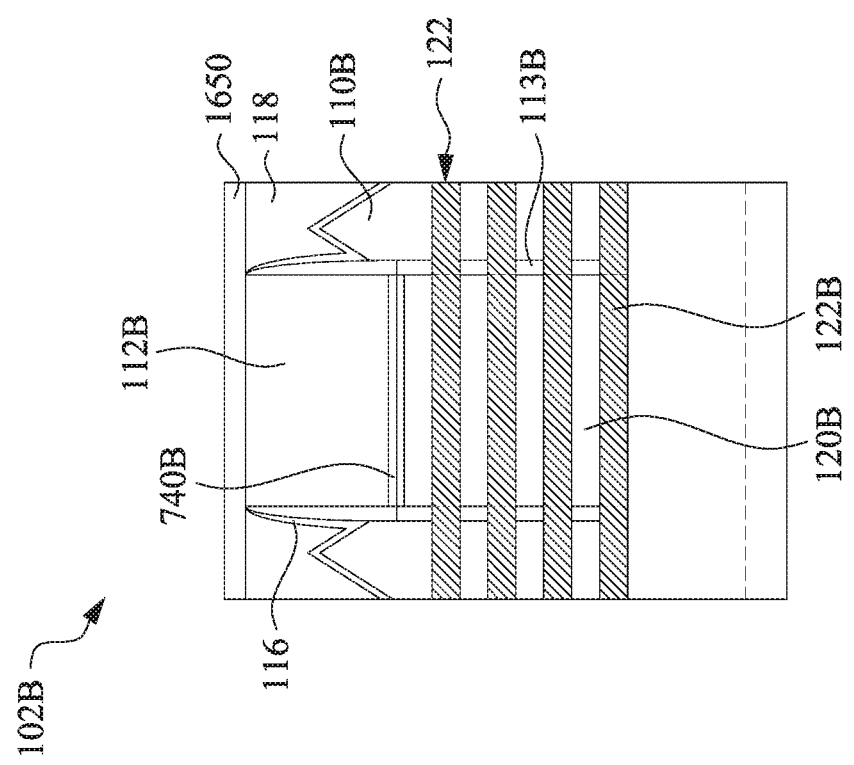
Figure 17D:
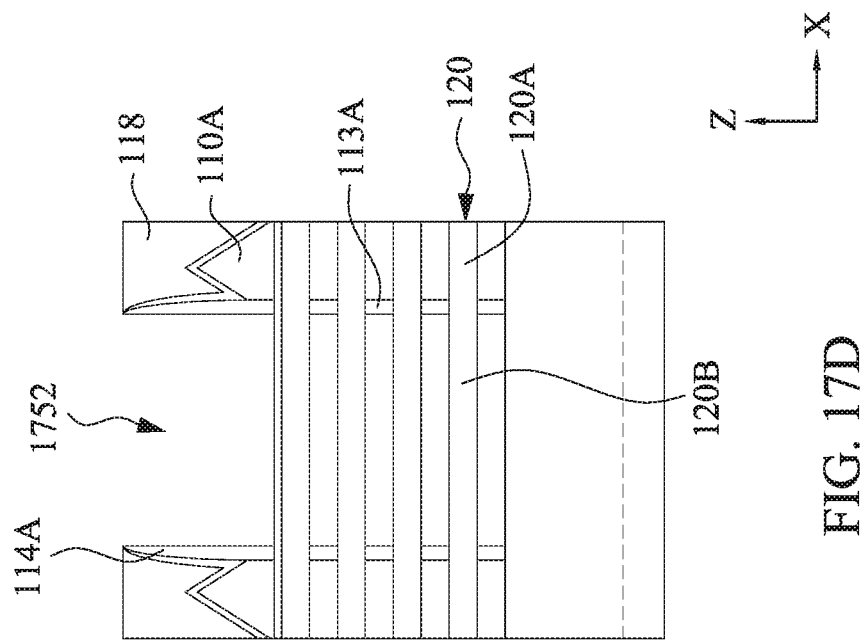
Figure 17C:
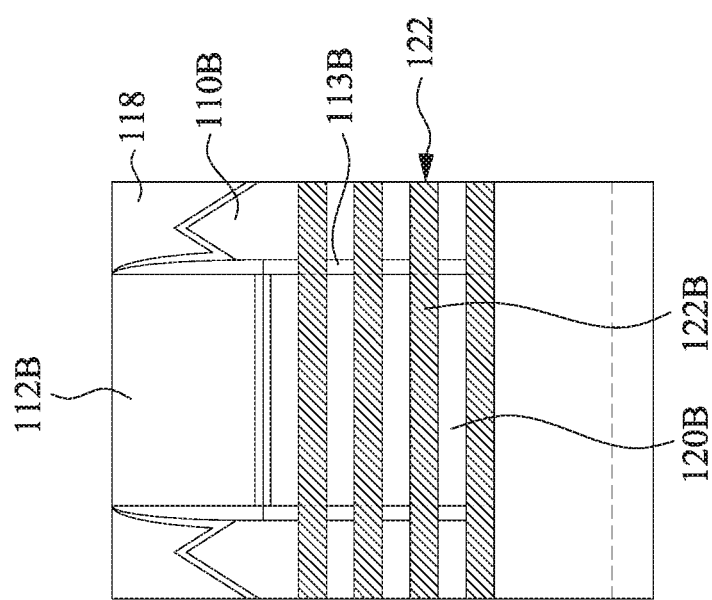

Following the CMP process, nanostructured channel regions 120B of FET 102A can be formed as shown in FIGS. 17B and 17D. The process for forming nanostructured channel regions 120B can include sequential steps of (i) forming a photoresist layer 1650 on FET 102B as shown in FIGS. 16A-16C, (ii) etching polysilicon structure 112A* and protective oxide layer 740A from the structure of FIG. 16A, and (iii) etching nanostructured regions 122B from the structure of FIG. 16A. In some embodiments, polysilicon structure 112A* and protective oxide layer 740A can be etched using the first, second, third, and/or fourth polysilicon etch steps described in operation 320. In some embodiments, nanostructured regions 122B can be etched using a wet etch process similar to that used for etching nanostructured regions 122A described with reference to FIGS. 10A-10D. As a result of the etching of nanostructured regions 122B, nanostructured channel regions 120B are formed with opening 1752 around them as shown in FIGS. 17B and 17D.

Figure 18B:
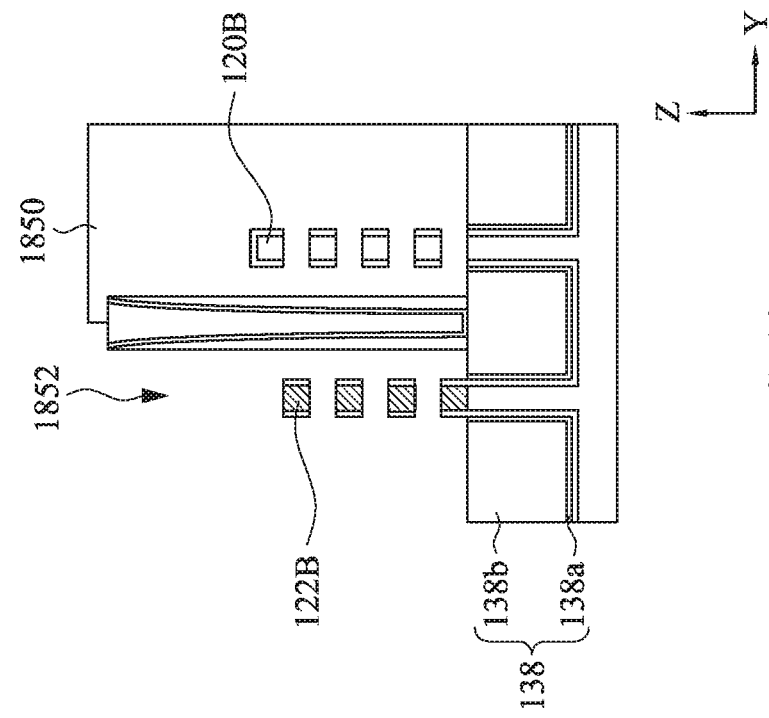
Figure 18A:
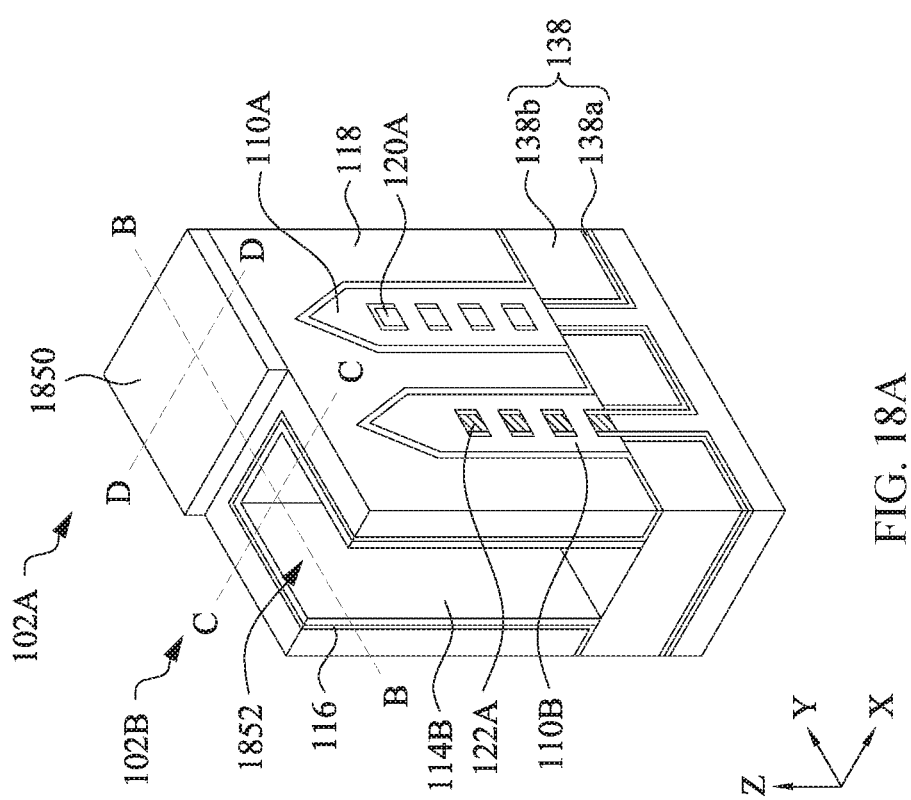
Figure 19D:
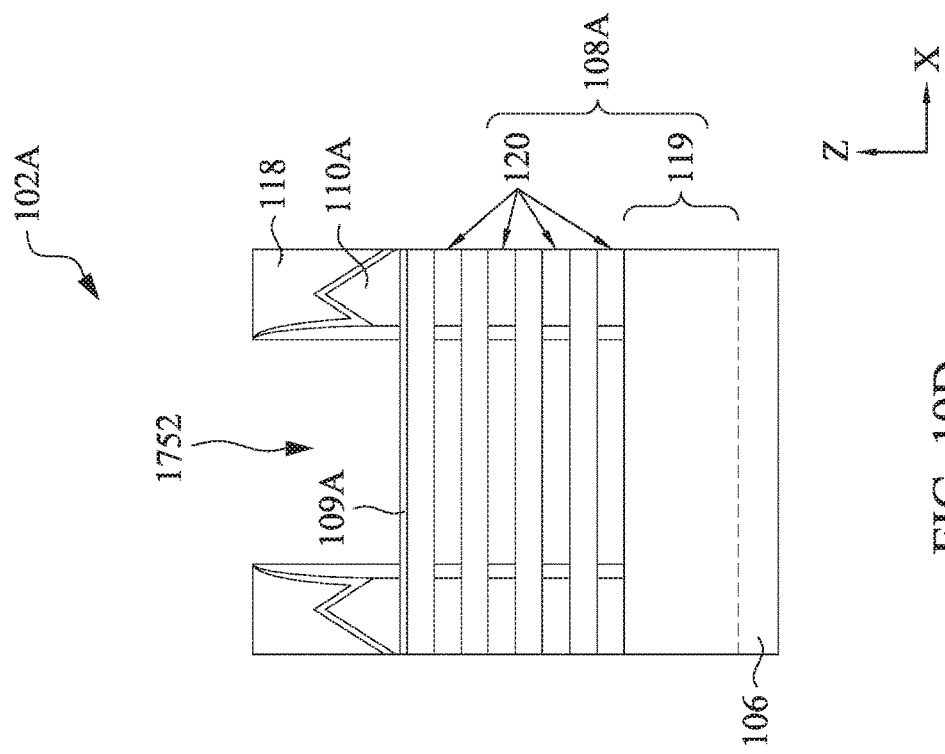
Figure 19C:
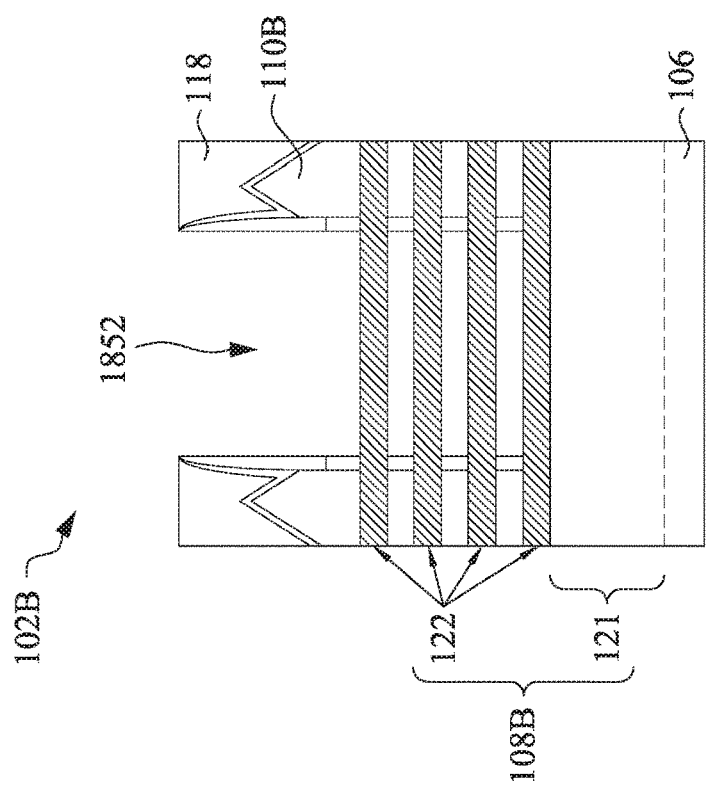

Following the etching of nanostructured regions 122B, nanostructured channel regions 122B of FET 102B can be formed as shown in FIGS. 18B-18C. The process for forming nanostructured channel regions 122B can include sequential steps of (i) removing photoresist layer 1650, (ii) forming a photoresist layer 1850 within opening 1752 (shown in FIGS. 17B and 17D) to protect nanostructured channel regions 120A as shown in FIGS. 18B and 18D, (iii) etching polysilicon structure 112B* and protective oxide layer 740B, and (iv) etching nanostructured regions 120B from the structure of FIG. 17A. Similar to the etching of polysilicon structure 112A* and protective oxide layer 740A, polysilicon structure 112B* and protective oxide layer 740B can be etched using the first, second, third, and/or fourth polysilicon etch steps described in operation 320. In some embodiments, nanostructured regions 120B can be etched using a wet etch process similar to that used for etching nanostructured regions 120A described with reference to FIGS. 13A-13D. As a result of the etching of nanostructured regions 120B, nanostructured channel regions 122B are formed with opening 1852 around them as shown in FIGS. 18B and 18D. Following the formation of nanostructured channel regions 122B of FET 102B, photoresist layer 1850 can be removed from opening 1752 to form the structure of FIGS. 19A-19D.

Referring to FIG. 3, in operation 340, gate-all-around (GAA) structures are formed on the nanostructured channel regions. For example, gate structures 112A-112B can be formed wrapped around nanostructured channel regions 120B and 122B, as described with reference to FIGS. 19A-19D and 1B-1D. The process for forming gate structures 112A-112B can include the sequential steps of (i) blanket depositing a layer of dielectric material for gate dielectric layers 128A-128B on the structure of FIG. 19A, (ii) blanket depositing a layer of work function metal for gate work function metal layers 130A-130B on the layer of dielectric material, and (iii) blanket depositing a layer of conductive material for gate metal fill layers 132A-132B on the layer of work function metal until openings 1752 and 1852 are filled. In some embodiments, as shown in FIG. 1B, the layers of dielectric material, and work function metal, can each form conformal layers within openings 1752 and 1852 (shown in FIGS. 19B-19D).

The layer of dielectric material for gate dielectric layers 128A-128B can include silicon oxide and can be formed by CVD, atomic layer deposition (ALD), physical vapor deposition (PVD), e-beam evaporation, or other suitable processes. In some embodiments, the layer of dielectric material can include (i) a layer of silicon oxide, silicon nitride, and/or silicon oxynitride, (ii) a high-k dielectric material such as, for example, hafnium oxide ($HfO_2$), $TiO_2$, HfZrO, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers can be formed by ALD and/or other suitable methods.

The layer of work function metal for work function metal layers 130A-130B can include Al, Cu, W, Ti, Ta, TiN, TaN, NiSi, CoSi, Ag, TaC, TaSiN, TaCN, TiAl, TiAlN, WN, metal alloys, and/or combinations thereof. In some embodiments, the layer of work function metal can include Al-doped metal, such as Al-doped Ti, Al-doped TiN, Al-doped Ta, or Al-doped TaN. The layer of work function metal can be deposited using a suitable process such as ALD, CVD, PVD, plating, or combinations thereof. The layer of conductive material for gate electrodes 132 can include Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof and can be formed by ALD, PVD, CVD, or other suitable deposition processes. The deposited layers of dielectric material, work function metal, and conductive material can be planarized by a CMP process to form the structure of FIG. 1A. The CMP process can substantially coplanarize top surfaces of gate dielectric layers 128A-128B, gate work function metal layers 130A-130B, and gate metal fill layers 132A-132B with top surface of ILD layer 118 as shown in FIGS. 1A-1D.

The formation of gate structures 112A-112B can be followed by formation of other elements such as S/D contacts, gate contacts, vias, interconnect metal layers, dielectric layers, passivation layers, etc., which are not shown for the sake of clarity.

The present disclosure provides example structures and methods for reducing parasitic capacitance in FET devices (e.g., FETs 102A-102B). Reducing parasitic capacitance in FET devices can improve FET device performance. The example structures and methods provide inner spacer structures (e.g., inner spacers 113A-113B) between source/drain (S/D) regions and GAA structures of FET devices to reduce parasitic capacitance between them. The parasitic capacitance can arise from capacitive coupling between the S/D regions and GAA structures during FET operation and can negatively impact FET device performance (e.g., at high frequencies). In some embodiments, the inner spacer structures can be disposed between epitaxial S/D regions and GAA structures of the FET devices and can include low-k dielectric materials and/or air-gaps. The inner spacer structures described herein can reduce the parasitic capacitance between the S/D regions and GAA structures by about 20% to about 60% compared to the parasitic capacitance in FET devices without such inner spacer structures.

In some embodiments, a semiconductor device includes a substrate, a stack of nanostructured layers with first and second nanostructured regions disposed on the substrate and first and second source/drain (S/D) regions disposed on the substrate. Each of the first and second S/D regions includes an epitaxial region wrapped around each of the first nanostructured regions. The semiconductor device further includes a gate-all-around (GAA) structure disposed between the first and second S/D regions and wrapped around each of the second nanostructured regions, a first inner spacer disposed between an epitaxial sub-region of the first S/D region and a gate sub-region of the GAA structure, a second inner spacer disposed between an epitaxial sub-region of the second S/D region and the gate sub-region of the GAA structure, and a passivation layer disposed on sidewalls of the first and second nanostructured regions.

In some embodiments, a semiconductor device includes a substrate, a first field effect transistor (FET) and a second FET. The first FET includes a stack of first nanostructured layers disposed on the substrate and a first epitaxial region wrapped around each of the first nanostructured regions. Each of the first nanostructured layers includes first and second nanostructured regions. The first FET further includes a first gate-all-around (GAA) structure disposed on the stack of first nanostructured layers and wrapped around each of the second nanostructured regions and first and second inner spacers disposed within the stack of first nanostructured layers. The second FET includes a stack of second nanostructured layers disposed on the substrate and a second epitaxial region wrapped around each of the third nanostructured regions. The second nanostructured layers have a material composition different from the first nanostructured layers and each of the second nanostructured layers comprises third and fourth nanostructured regions. The second epitaxial region is a conductivity type different from the first epitaxial region. The second FET further includes a second GAA structure disposed on the stack of second nanostructured layers and wrapped around each of the fourth nanostructured regions and third and fourth inner spacers disposed within the stack of second nanostructured layers. The third and fourth inner spacers have a material composition different from the first and second inner spacers.

In some embodiments, a method for fabricating a semiconductor device includes forming a stack of first nanostructured layers with first and second nanostructured regions on a substrate, growing first and second epitaxial regions wrapped around each of the first nanostructured regions, forming a gate-all-around (GAA) structure between the first and second epitaxial regions and wrapped around each of the second nanostructured regions, forming first and second inner spacers along sidewalls of gate sub-regions of the GAA structure, wherein the gate sub-regions are embedded within the stack of nanostructured layers, and forming a passivation layer along sidewalls of each of the first and second nanostructured regions.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a stack of nanostructured layers with first and second nanostructured regions disposed on the substrate;
first and second source/drain (S/D) regions disposed on the substrate, wherein each of the first and second S/D regions comprises an epitaxial region wrapped around each of the first nanostructured regions;
a gate-all-around (GAA) structure disposed between the first and second S/D regions and wrapped around each of the second nanostructured regions;
a first inner spacer disposed between an epitaxial sub-region of the first S/D region and a gate sub-region of the GAA structure;
a second inner spacer disposed between an epitaxial sub-region of the second S/D region and the gate sub-region of the GAA structure; and
a passivation layer disposed on sidewalls of the first and second nanostructured regions.

2. The semiconductor device of claim 1, wherein the first and second inner spacers are disposed on sidewalls of the gate sub-regions embedded between adjacent nanostructured layers in the stack of nanostructured layers.

3. The semiconductor device of claim 1, wherein a first portion of the passivation layer is disposed between the epitaxial region and the stack of nanostructured layers and a second portion of the passivation layer is disposed on the sidewalls of the first and second nanostructured regions.

4. The semiconductor device of claim 1, further comprising first and second outer spacers disposed on the first and second inner spacers, respectively.

5. The semiconductor device of claim 1, further comprising first and second outer spacers disposed on sidewalls of the GAA structure that are not covered by the first and second inner spacers.

6. The semiconductor device of claim 5, where interfaces between the GAA structure and the first and second outer spacers are substantially aligned with interfaces between the GAA structure and the first and second inner spacers.

7. The semiconductor device of claim 1, further comprising first and second outer spacers disposed on sidewalls of the GAA structure, wherein the passivation layer extends under the first and second outer spacers.

8. The semiconductor device of claim 1, further comprising first and second outer spacers disposed on the first and second inner spacers, respectively, wherein a distance between the first and second outer spacers is greater than a distance between the first and second inner spacers.

9. A semiconductor device, comprising:
a substrate;
a first field effect transistor (FET) comprising:
a stack of first nanostructured layers disposed on the substrate, wherein each of the first nanostructured layers comprises first and second nanostructured regions,
a first epitaxial region wrapped around each of the first nanostructured regions;
a first gate-all-around (GAA) structure disposed on the stack of first nanostructured layers and wrapped around each of the second nanostructured regions, and
first and second inner spacers disposed within the stack of first nanostructured layers, wherein the first and second inner spacers comprise a low-k dielectric material; and
a second FET comprising:
a stack of second nanostructured layers disposed on the substrate, wherein the second nanostructured layers have a material composition different from the first nanostructured layers, and wherein each of the second nanostructured layers comprises third and fourth nanostructured regions,
a second epitaxial region wrapped around each of the third nanostructured regions, wherein the second epitaxial region is a conductivity type different from the first epitaxial region,
a second GAA structure disposed on the stack of second nanostructured layers and wrapped around each of the fourth nanostructured regions,
third and fourth inner spacers disposed within the stack of second nanostructured layers, wherein the third and fourth inner spacers have a material composition different from the first and second inner spacers, and
first and second passivation layers disposed on sidewalls of the first and second nanostructured layers.

10. The semiconductor device of claim 9, wherein the third and fourth inner spacers comprise a low-k dielectric material.

11. The semiconductor device of claim 9, wherein at least the first and second inner spacers or the third and fourth inner spacers comprise a low-k dielectric gas.

12. The semiconductor device of claim 9, wherein the first and second inner spacers are disposed on sidewalls of gate sub-regions of the first GAA structure and wherein the gate sub-regions are embedded within the stack of first nanostructured layers.

13. The semiconductor device of claim 9, wherein the stack of first nanostructured layers is vertically displaced from the substrate by a gate sub-region of the GAA structure, a sub-region of the first epitaxial region, and the first and second inner spacers; and
wherein the stack of second nanostructured layers is in physical contact with the substrate.

14. A method for fabricating a semiconductor device, comprising:
forming a stack of first and second nanostructured layers on a substrate, wherein the first nanostructured layers comprise first and second nanostructured regions and the second nanostructured layers comprise third and fourth nanostructured regions;

forming first and second inner spacers along sidewalls of the fourth nanostructured regions;

growing first and second epitaxial regions around each of the first nanostructured regions;

forming a gate-all-around (GAA) structure between the first and second epitaxial regions and around each of the second nanostructured regions; and forming a passivation layer along sidewalls of each of the first and second nanostructured regions.

15. The method of claim 14, wherein the forming the first and second inner spacers is performed prior to the growing the first and second epitaxial regions.

16. The method of claim 14, wherein the forming the passivation layer is performed prior to the forming the first and second inner spacers.

17. The method of claim 14, wherein the forming the stack of first and second nanostructured layers comprises:

epitaxially growing first and second semiconductor layers of different compositions in an alternating configuration on the substrate; and etching the first and second semiconductor layers to form the first and second nanostructured layers.

18. The method of claim 14, wherein the forming the first and second inner spacers comprises:

etching the third nanostructured regions of the second nanostructured layers to form openings between the first nanostructured regions of the first nanostructured layers;

depositing a layer of low-k dielectric material in the openings; and etching back the layer of low-k dielectric material in the openings.

19. The method of claim 14, wherein the forming the GAA structure comprises:

etching the fourth nanostructured regions of the second nanostructured layers to form openings between the second nanostructured regions of the first nanostructured layers;

depositing a layer of gate dielectric material in the openings; and depositing a layer of electrically conductive material on the layer of gate dielectric material to fill the openings.

* * * * *